: US007532138B2

United States Patent
Akizuki et al.

(10) Patent No.: US 7,532,138 B2
(45) Date of Patent: May 12, 2009

(54) DELTA-SIGMA MODULATOR AND DA CONVERTER APPARATUS INCLUDING DELTA-SIGMA MODULATOR CHANGING ORDER OF FILTER

(75) Inventors: Taiji Akizuki, Miyagi (JP); Tomoaki Maeda, Kyoto (JP); Masahiko Sagisaka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/035,344

(22) Filed: Feb. 21, 2008

(65) Prior Publication Data
US 2008/0198050 A1 Aug. 21, 2008

(30) Foreign Application Priority Data
Feb. 21, 2007 (JP) .............................. 2007-040850

(51) Int. Cl.
*H03M 3/00* (2006.01)
(52) U.S. Cl. ...................... 341/143; 341/155
(58) Field of Classification Search ................. 341/143, 341/155, 144
See application file for complete search history.

(56) References Cited
U.S. PATENT DOCUMENTS
6,087,969 A * 7/2000 Stockstad et al. ........... 341/143

6,700,519 B2 * 3/2004 Yamamoto .................. 341/143
6,839,012 B2 1/2005 Kawamura
7,129,873 B2 * 10/2006 Kawamura .................. 341/143
7,324,036 B2 * 1/2008 Petre et al. .................. 341/155

FOREIGN PATENT DOCUMENTS
JP 2004-080152 3/2004

OTHER PUBLICATIONS
Koh, Jinseok, "A 66dB DR 1.2V 1.2mW Single-Amplifier Double-Sampling 2nd-order ADC for WCDMA in 90 nm CMOS," 2005 IEEE International Solid-State Circuits Conference.

* cited by examiner

*Primary Examiner*—Peguy JeanPierre
(74) *Attorney, Agent, or Firm*—McDermott Will & Emery LLP

(57) ABSTRACT

In a delta-sigma modulator including first and second subtractors, first and second integrators, a quantizer, and a DA converter, a first feedback circuit includes first charge holding circuits which hold charges of the analog signal from the DA converter for different sampling intervals, can change a feedback amount of the analog signal from the DA converter, and outputs the analog signal from each first charge holding circuits to the second subtractor. A second feedback circuit includes second charge holding circuits which hold charges of the analog signal from the second integrator for different sampling intervals, can change a feedback amount of the analog signal from the second integrator, and outputs an analog signal from each of the second charge holding circuits to the second subtractor. A controller switches an order of filter characteristic of the delta sigma modulator by changing feedback amounts of the first and second feedback circuits.

13 Claims, 15 Drawing Sheets

{ (a) SWITCH TIMING SIGNAL φ1
  (b) SWITCH TIMING SIGNAL φ2

71,72,73

DELTA-SIGMA MODULATOR AND DA CONVERTER APPARATUS INCLUDING DELTA-SIGMA MODULATOR CHANGING ORDER OF FILTER

BACKGROUND OF THE INVENTION

1. Field of the Invention

The present invention is related to a delta-sigma modulator, and a delta-sigma digital to analog converter (hereinafter, the digital to analog converter is referred to a DA converter) apparatus including the same delta-sigma modulator for changing an order of filter. In particular, the present invention is related to a delta-sigma DA converter apparatus used in a wireless receiver as required for use in, for example, a high-rate clock operation and to have a high SNR (Signal to Noise Ratio).

2. Description of the Related Art

Conversion of an analog signal into a digital signal enables a signal to be transmitted and processed easily and efficiently. Therefore, an analog-to-digital converter (referred to as an AD converter hereinafter) is an important function for a wireless receiver employed in a portable telephone or the like. According to acceleration of data rate to follow recent use of a broadband communication method, it is necessary even for an AD converter to simultaneously realize low power consumption, high-rate clock operation, and a high SNR. Accordingly, an operation clock of a delta-sigma AD converter that can easily realize a high SNR and that has been used in a measuring device or the like has been accelerated.

FIG. 17 is a block diagram showing a configuration of a variable-order delta-sigma modulator according to a first prior art disclosed in, for example, Japanese patent laid-open publication No. JP-2004-080152-A. Referring to FIG. 17, the variable-order delta-sigma modulator is configured to include integrators 71 to 73 each including a plurality of operational amplifiers, one-sample delay units 101 to 103 and 111 to 113, operational amplifiers 81 to 83 and 91 to 93, subtractors 121 to 125, a feedback circuit F11 including switches 61 and 62, a feedback circuit F12, a quantizer 65, a DA converter (DAC) 66, and a controller 60 controlling the switches 61 and 62 to be turned on or off. This variable-order digital-sigma modulator has a closed loop structure in which a digital output signal from the quantizer 65 is converted into an analog signal by the DA converter 66, and the analog signal is supplied to the subtractors 121, 122, and 124 via the feedback circuit F12. In this case, the variable-order digital-sigma modulator is configured to provide the switches 61 and 62 in the feedback circuit F12 to switch the order of a filter so as to deal with a plurality of systems. The filter of the modulator serves as a third-order filter when both the switches 61 and 62 are turned off, and serves as a second-order filter when only the switch 62 is turned on.

FIG. 18 is a block diagram showing a configuration of each of the integrators 71, 72, and 73 shown in FIG. 17. In FIG. 18, as well known, each of the integrators 71, 72, and 73 is a temporal integrator configured to include a subtractor 131 and a one-sample delay unit 132.

FIG. 19 is a block diagram showing a configuration of a variable-order delta-sigma modulator according to a second prior art disclosed in, for example, the Japanese patent laid-open publication No. JP-2004-080152-A. Referring to FIG. 19, the variable-order delta-sigma modulator is configured to include a plurality of integrators 71 to 75, one-sample delay units 101 to 105 and 111 to 114, operational amplifiers 81 to 85 and 91 to 94, subtractors 121 to 128, a feedback circuit F11 including switches 61 to 64, a feedback circuit F12, a quantizer 65, a DA converter (DAC) 66, and a controller 60a controlling the switches 61 to 64 to be turned on or off. A filter of the modulator shown in FIG. 19 serves as a maximum fifth-order filter when the switches 61 to 65 are all turned on.

According to the first and second prior arts, a signal band is a wide-band. However, the operational amplifier having the higher-order filter characteristic has such problems that the number of operational amplifiers increases to increase power consumption and a circuit area considerably increases. In order to solve the problems, a multiplexed-operational-amplifier circuit is proposed as a method of decreasing the number of operational amplifiers, in Jinseok Koh et al., "A 66 dB DR 1.2V 1.2 mW Single-Amplifier Double-Sampling 2nd-order $\Delta\Sigma$ ADC for WCDMA in 90 nm CMOS", Solid-State Circuits Conference (SSCC) 2005, Digest of technical papers, Session 9, 9.3, pp. 170-171, Vol. 1, Feb. 6-10, 2005 (referred to as Jinseok Koh et al. hereinafter).

FIG. 20 is a block diagram showing a configuration of a delta-sigma modulator according to a third prior art disclosed in, for example, Jinseok Koh et al. Referring to FIG. 20, the delta-sigma modulator is configured as follows, as compared with the first and second prior arts. A feedback circuit F11 is configured to in parallel connect a feedback circuit constituted by an operational amplifier 91 to a feedback circuit constituted by an operational amplifier 142 and a one-sample delay unit 152. A feedback circuit F12 is configured to in parallel connect a feedback circuit constituted by an operational amplifier 91 to a feedback circuit constituted by an operational amplifier 92 and a one-sample delay unit 112. Namely, the delta-sigma modulator is configured to multiplex the integrator constituted by the operational amplifier in each of the feedback circuits F11 and F12.

The delta-sigma modulator shown in FIG. 20 is configured so that the feedback circuit F11 includes "n" output signals from the integrators (where "n" is a natural number equal to or larger than two) for "n" samplings ("n" delays) before to the sampling to be processed, and the feedback circuit F12 includes "n" output signals from the DA converters for "n" samplings ("n" delays) before to the sampling to be processed. The feedback signals from the respective feedback circuits F11 and F12 are fed back to a subtractor 121 connected to an input terminal of the integrator 71. It is thereby possible to exhibit an equivalent low-pass filter characteristic to that when "n" integrators are used, and to realize a higher SNR by an "n"-th-order noise shaping effect.

It is necessary for the delta-sigma modulator configured as stated above according to the third prior art to increase an integral capacity so as to realize a high SNR in a signal band having a narrow signal bandwidth and to reduce noise of the operational amplifier 81 of the first stage. In this case, kT/C noise is generated when the integral capacity samples thermal noise. When the integral capacity is Ch and a feedback capacity is Cs, then it is disadvantageously necessary to increase the feedback capacity Cs because of a constant gain ratio (Cs/Ch), and it is disadvantageously impossible to reduce current consumption.

SUMMARY OF THE INVENTION

It is an object of the present invention to provide a delta-sigma modulator capable of solving the above-stated problems, reducing a circuit area by switching the order of a filter without increasing the number of operational amplifiers, and reducing current consumption.

It is another object of the present invention to provide a delta-sigma DA converter apparatus using the delta-sigma modulator.

According to the first aspect of the present invention, a delta-sigma modulator includes first and second subtractors, first and second integrators, a quantizer, a DA converter, first and second feedback circuits, and a controller. The first subtractor subtracts an inputted second input signal from an inputted first input signal, and outputs an analog signal representing a subtraction result of the first subtractor. The first integrator integrates the analog signal outputted from the first subtractor, and outputs an integrated analog signal. The second subtractor subtracts a sum of an inputted third analog signal and an inputted fourth analog signal from the analog signal outputted from the first integrator, and outputs an analog signal representing a subtraction result of the second subtractor. The second integrator integrates the analog signal outputted from the second subtractor, and outputting an integrated analog signal. The quantizer quantizes the analog signal outputted from the second integrator into a digital signal, and outputs the digital signal. The DA converter DA-converts the digital signal outputted from the quantizer into an analog signal, and outputs the analog signal.

The first feedback circuit includes a plurality of first charge holding circuits for holding electric charges of the analog signal outputted from the DA converter for different sampling intervals, respectively. The first feedback circuit is capable of changing a feedback amount of the analog signal outputted from the DA converter, and outputs the analog signal from each of the first charge holding circuits to the second subtractor as a third analog signal. The second feedback circuit includes a plurality of second charge holding circuits for holding electric charges of the analog signal outputted from the second integrator for different sampling intervals, respectively. The second feedback circuit is capable of changing a feedback amount of the analog signal outputted from the second integrator, and outputs an analog signal from each of the second charge holding circuits to the second subtractor as a fourth analog signal. The controller switches an order of a filter of a filter characteristic of the delta sigma modulator by changing feedback amounts of the first and second feedback circuits.

In the above-mentioned delta-sigma modulator, each of the first and second feedback circuits is configured to switch over between a filter characteristic of zero-point shift and a filter characteristic of no zero-point shift by switching the order of the filter by the controller.

In the above-mentioned delta-sigma modulator, each of the first and second charge holding circuits included in the first and second feedback circuits is made to operate at a double sampling timing.

In the above-mentioned delta-sigma modulator, each of the first and second feedback circuits include a fundamental clock generator circuit, and an n-timing-delay clock generator circuit. The fundamental clock generator circuit generates a fundamental clock. The n-timing-delay clock generator circuit generates an n-timing-delay clock signal delayed from the fundamental clock by an interval of "n" samples, where "n" is a natural number equal to or larger than two. The "n"-timing-delay clock generator circuit generates the n-timing-delay signal by combining the fundamental clock output from the fundamental clock generator circuit with an n-frequency-divided clock, and the controller switches an operation performed by the n-timing-delayed clock generator circuit according to switching of the order of the filter.

In the above-mentioned delta-sigma modulator, the controller converts an inputted N-bit order-of-filter control signal indicating the order of the filter into N one-bit switch control signals, and outputs the N one-bit switch control signals, thereby changing the feedback amounts of the first and second feedback circuits and switching the order of the filter for the filter characteristic of the delta-sigma modulator.

In the above-mentioned delta-sigma modulator, the controller changes a bias current applied to each of the first and second integrator according to an order-of-filter control signal.

In the above-mentioned delta-sigma modulator, the quantizer is constituted by a latch comparator.

In the above-mentioned delta-sigma modulator, the controller changes number of quantization bits of the quantizer according to the order-of-filter control signal.

In the above-mentioned delta-sigma modulator, each of the first and second charge holding circuits is constituted by a switched capacitor circuit.

In the above-mentioned delta-sigma modulator, the switched capacitor circuit includes, a MOS transistor switch, a dummy switch, and a capacitor. The dummy switch is constituted by a MOS transistor having a drain and a source connected to an output side of the MOS transistor switch. The dummy switch and the MOS transistor switch are constituted so that a gate area of the dummy switch is half of a gate area of the MOS transistor switch, and the controller controls the dummy switch and the MOS transistor switch to be turned off at the same timing.

In the above-mentioned delta-sigma modulator, each of the MOS transistor switch and the dummy switch is constituted by a CMOS transistor.

In the above-mentioned delta-sigma modulator, the capacitor is constituted by providing an insulator between a pair of metal wirings.

According to the second aspect of the present invention, there is provided a delta-sigma DA converter apparatus including an over-sampling circuit, a noise shaper circuit, and a low-pass filter. The over-sampling circuit over-samples an inputted digital signal. The noise shaper circuit includes the delta-sigma modulator, and shapes the noise of the over-sampled digital signal. The low-pass filter low-pass-filters a noise-shaped digital signal, and outputting a low-pass-filtered noise-shaped digital signal, As stated so far in detail, the delta-sigma modulator according to the present invention and the delta-sigma DA converter apparatus using the delta-sigma modulator switches its filter characteristic by switching the order of the filter by multiplexing using the feedback circuits. It is thereby possible to switch the order of the filter without increasing the number of the operational amplifiers amplifying signals, and to reduce the circuit area. Further, the settling accuracy of the operational amplifiers of the later stages can be relaxed to prevent the SNR characteristic from being remarkably deteriorated, and the current consumption can be thereby reduced. Namely, the kT/C noise inputted to the operational amplifier of the former stage and the noise resulting from the insufficient settling accuracy are shifted to the range out of the signal band, which is a feature of the delta-sigma AD converter apparatus. Accordingly, the current consumed by the operational amplifiers of the later stages exhibiting the notable noise shaping effect can be reduced in the range in which the deterioration in the SNR is allowable.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Preferred embodiments according to the present invention will be described hereinafter with reference to the drawings. In each of the preferred embodiments, similar components are denoted by identical reference symbols. Before describing the preferred embodiments, inventor's considerations to the prior arts and substances of the present invention made by the inventor based on the considerations will be described.

Figure 21:
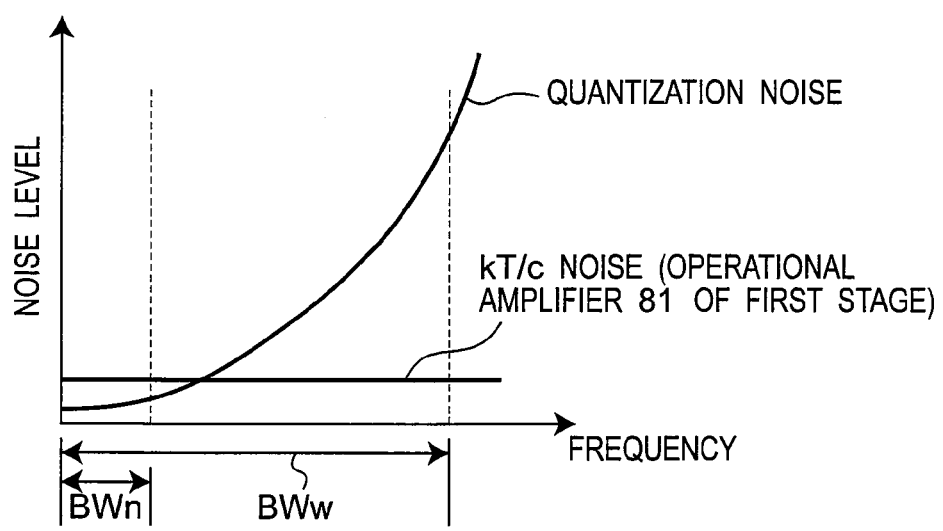
FIG. 21 is a graph showing a frequency characteristic relative to noise for an output signal from a delta-sigma AD converter apparatus including the delta-sigma modulator according to the prior arts.

FIG. 21 is a graph showing a frequency characteristic relative to noise for an output signal from a delta-sigma AD converter apparatus including the delta-sigma modulator according to the prior arts. In this case, each integrator of the delta-sigma A/D converter apparatus has a low-pass filter characteristic for passing through only low-frequency components and for cutting off high-frequency components. Due to this, the quantization noise generated by the quantizer 65 is white noise that does not depend on the frequency characteristic. However, the function of the analog integrator allows noise power at low frequency to be moved toward a high frequency side, and this leads to reduction in a noise power in the signal frequency band. This effect is normally known as "noise shaping effect".

In a system including a signal band having a relatively narrow signal bandwidth BWn, kT/C noise is larger than the quantization noise as shown in FIG. 21. In order to obtain a higher SNR, it is necessary to increase both the capacities Ch and Cs of the operational amplifier 81 of the first stage so as to reduce the kT/C noise. Further, when the order of the filter is made higher, the gain of the loop constituting the delta-sigma A/D converter apparatus increases. In order to suppress becoming unstable, it is necessary to reduce the input gain thereof. As a result, the input capacity Cs of the operational amplifier 81 of the first stage is reduced, so that the kT/C noise increases. Due to this, it is necessary to set the order of the filter to a lower order such as a second order in a signal band having a narrow signal bandwidth.

On the other hand, in a system including a signal band having a relatively wide signal bandwidth BWw, the kT/C noise is smaller than the quantization noise as shown in FIG. 21. Since a main cause of the noise is the quantization noise, it is necessary to provide a higher-order filter for noise attenuation.

Figure 19:
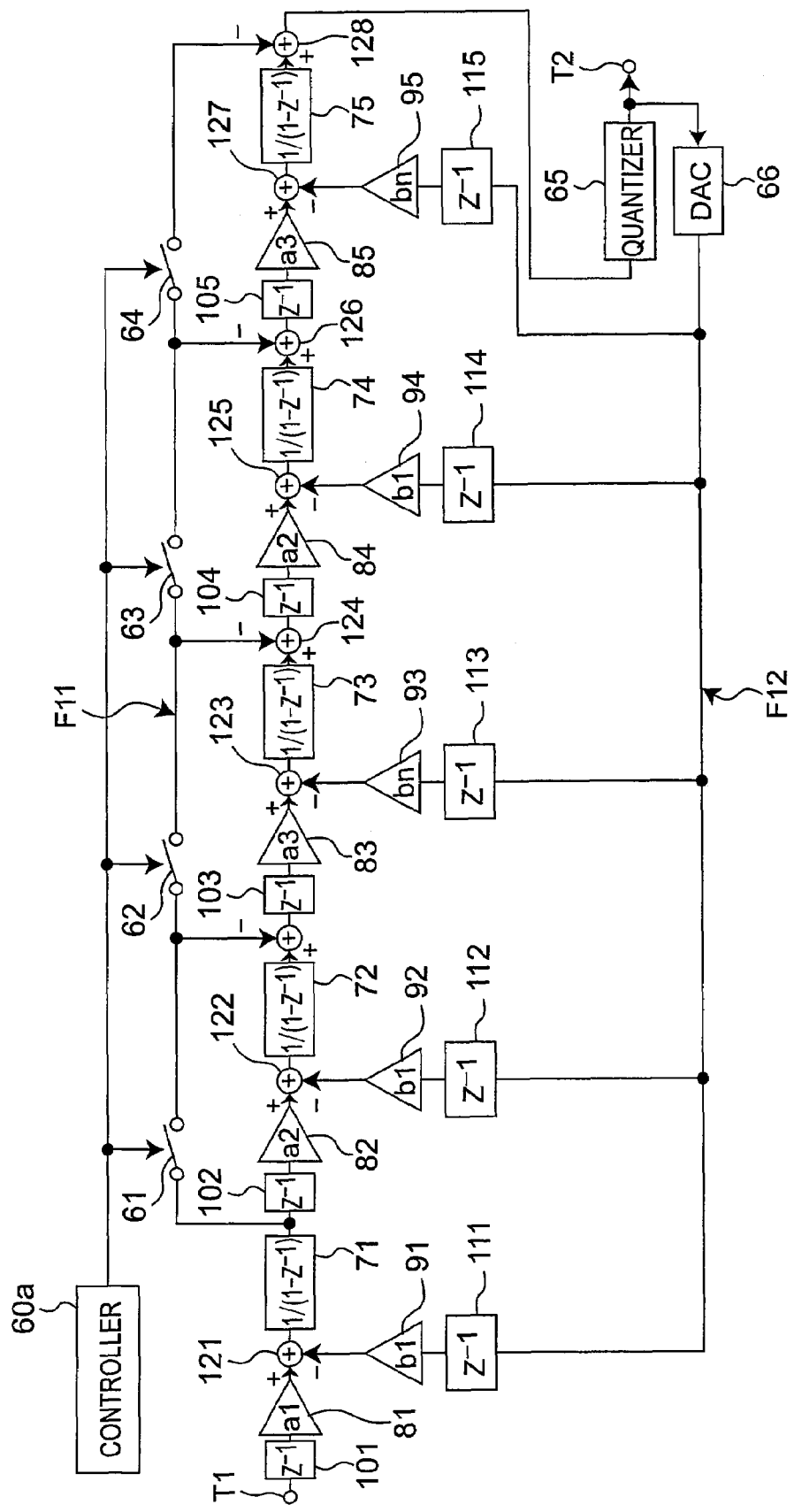
FIG. 19 is a block diagram showing a configuration of a variable-order delta-sigma modulator according to a second prior art.
Figure 20:
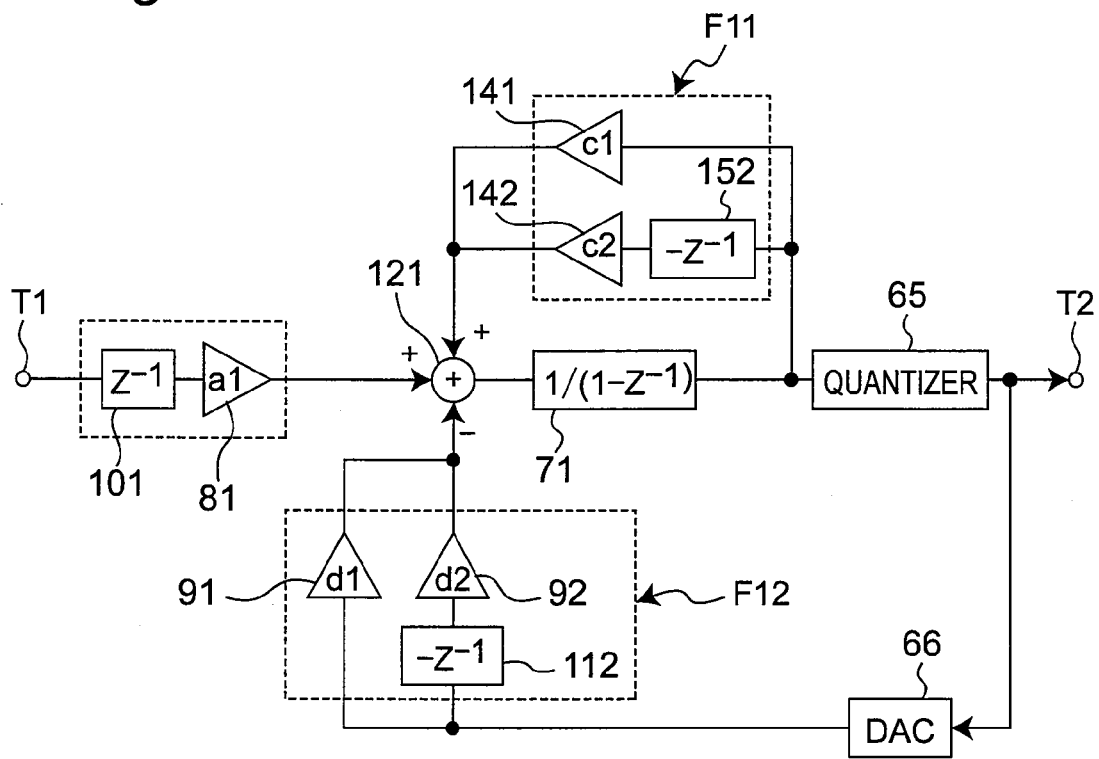
FIG. 20 is a block diagram showing a configuration of a variable-order delta-sigma modulator according to a third prior art.
Figure 22:
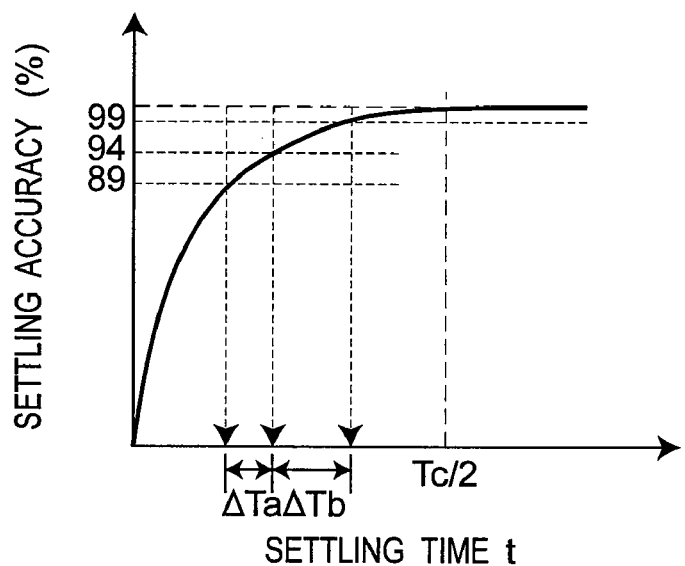
FIG. 22 is a graph showing a settling accuracy characteristic relative to settling time t for an output signal from an operational amplifier 81 shown in FIG. 19.

FIG. 22 is a graph showing a settling accuracy characteristic relative to settling time t for an output signal from an operational amplifier 81 shown in FIG. 19. When an n-th-order filter is used and even if the settling accuracy of the operational amplifiers of the second stage and the later stages is low, the low settling accuracy does not influence the SNR as long as the settling accuracy of the operational amplifier of the first stage is sufficiently high. However, when one operational amplifier is multiplexed, the amplitudes of output signals from all the operational amplifiers are combined. Due to this, the settling accuracy cannot be set to be low, and the current consumed by the operational amplifiers cannot be reduced. This is because the settling accuracy is proportional to the amplitude of the output signal from the operational amplifier and to the current consumed by the operational amplifier.

As shown in FIG. 22, the output-signal settling accuracy of the operational amplifier is improved exponentially according to the settling time. For example, settling time $\Delta Tb$ necessary to relax the settling accuracy of 99% by 5% is required to be longer than settling time $\Delta Ta$ necessary to relax the settling accuracy of 89% by 5%. That is, the settling time is proportional to a current of an operational amplifier electrically charged on an output load capacity of the operational amplifier. Due to this, at the same output load capacity, the current of the operational amplifier can be reduced exponentially according to a relaxation amount of the settling time.

Figure 23:
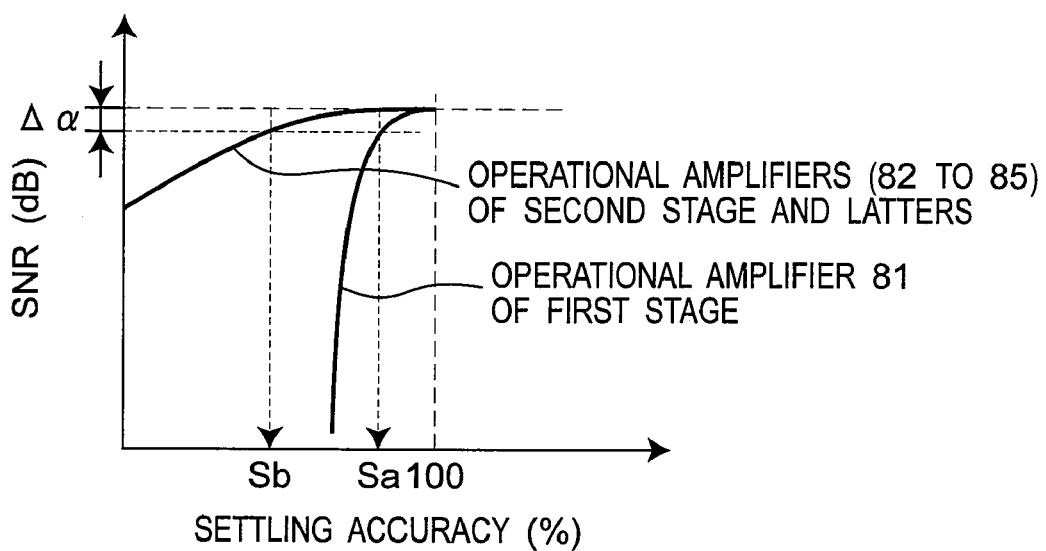
FIG. 23 is graph showing a signal-to-noise ratio (SNR) characteristic relative to a settling accuracy for an output signal from each of operational amplifiers 81 to 85 shown in FIG. 19.

FIG. 23 is a graph showing an SNR characteristic relative to settling accuracy for an output signal from each of operational amplifiers 81 to 85 shown in FIG. 19. In case of the delta-sigma A/D converter apparatus using the n-th-order filter, the noise generated by an insufficient settling is shifted to a higher frequency by the noise shaping effect in each of the operational amplifiers of the second stage and the later stages. Due to this, the operational amplifier of the first stage has a larger influence on the deterioration in the SNR resulting from the insufficient setline, and the operational amplifiers of the second stage and the later stages have smaller influence on the deterioration. As shown in FIG. 23, as the settling amount for deteriorating the SNR by $\Delta \alpha$ [dB], the settling accuracy Sb of the operational amplifier constituting each of the integrators 72 to 75 of the second and later stages is sufficiently smaller than the settling accuracy of the operational amplifier constituting the integrator 71 of the first stage. Therefore, the following respects are clear.

(1) Even if the settling accuracy of the operational amplifier constituting the integrator 71 of the first stage is improved and the settling accuracy of the operational amplifiers constituting the integrators 72 to 75 of the second and later stages is relaxed, the deterioration in the SNR is small.

(2) For the operational amplifiers constituting the integrators 72 to 75 of the second and later stages, it is possible to relax the setting accuracy and to reduce the current consumed by the operational amplifiers.

The substances of the present invention made based on the above-stated inventor's considerations are as follows.

(A) In a wireless communication system including a signal band having a narrow signal bandwidth of 200 kHz/channel such as a GSM (Global Systems for Mobile communications) wireless communication system, each feedback circuit is configured to include charge holding circuits operating based on a one-sampling clock delay signal and to have a lower-order filter characteristic.

Figure 12:
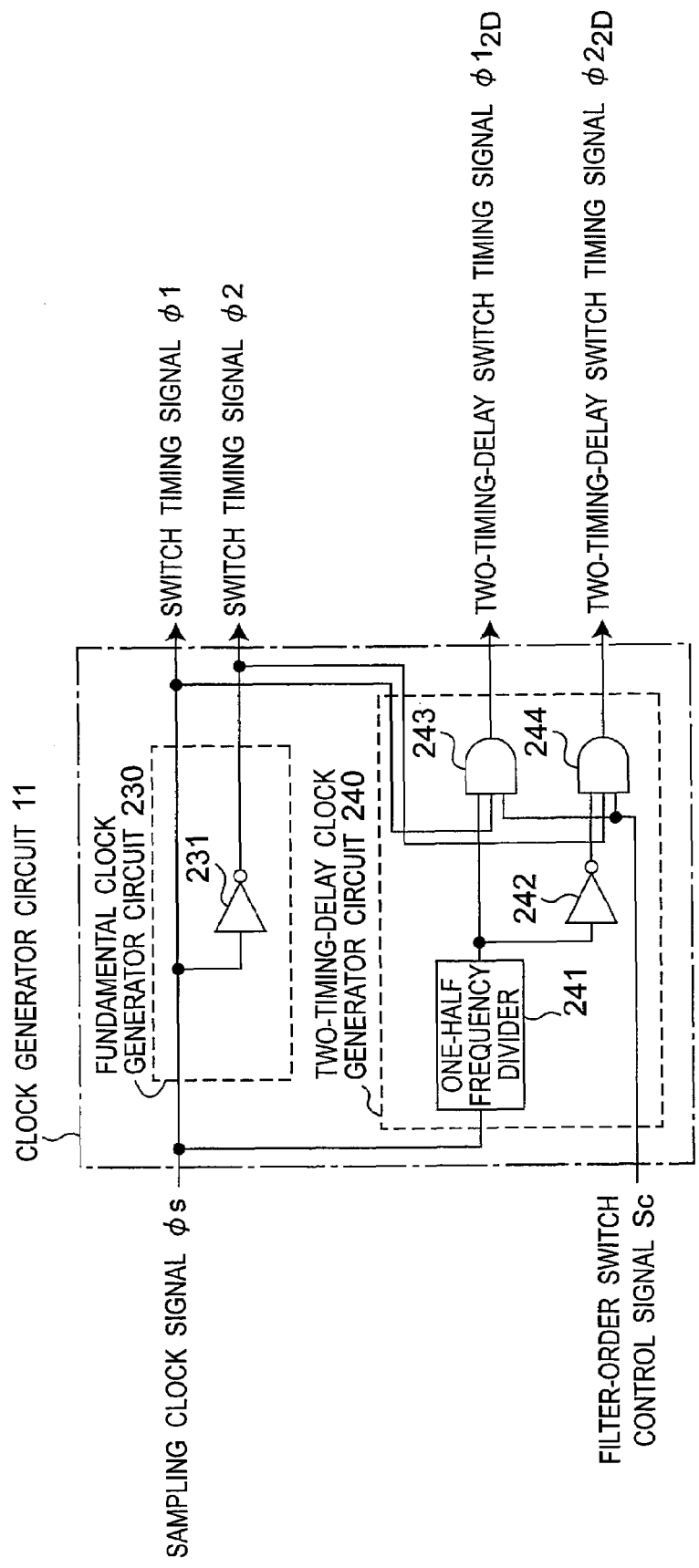
FIG. 12 is a circuit diagram showing a configuration of a clock generator circuit 11 shown in FIGS. 1 and 2.
Figure 13:
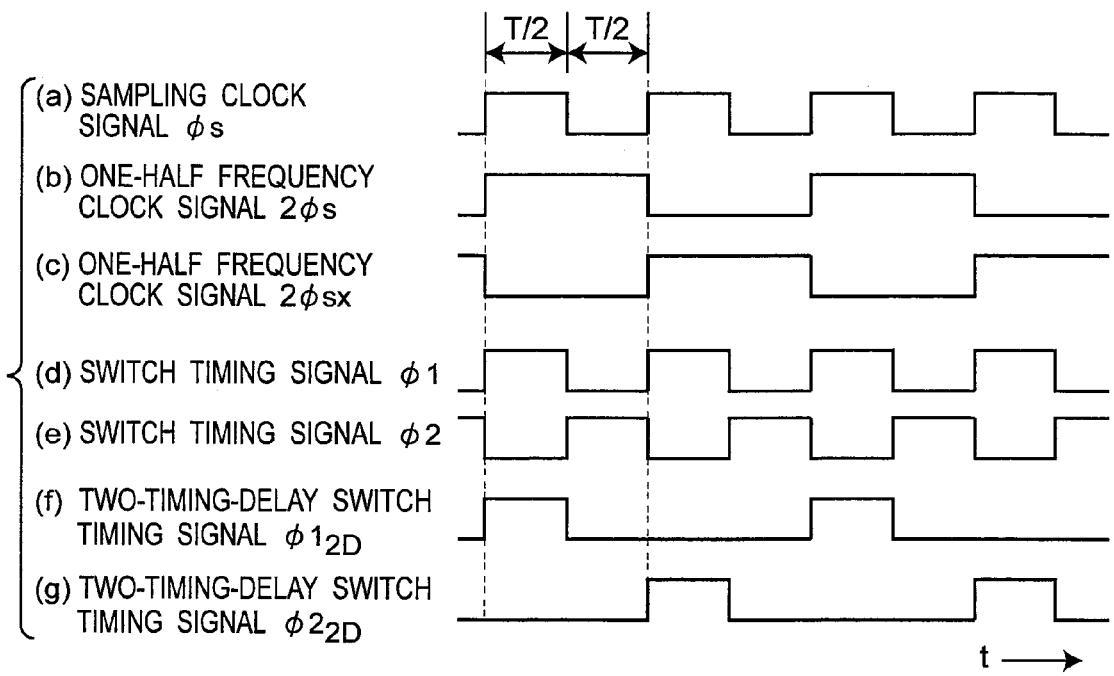
FIG. 13 is a timing chart of signals generated by the clock generator circuit 11 shown in FIG. 12.

(B) In a wireless communication system including a signal band having a wide signal bandwidth of 5 MHz/channel such as a wide CDMA (Code Division Multiple Access) wireless communication system, each feedback circuit is configured to include a higher-order filter characteristic that is configured by charge holding circuits operating based on signals having different sampling delay amounts (e.g., switch timing signals $\phi 1$ and $\phi 2$ and two-timing-delay switch timing signals $\phi 1_{2D}$ and $\phi 2_{2D}$ to be described later in detail with reference to FIGS. 12 and 13, where the two-timing-delay switch timing signal is a signal delayed by a period corresponding to two samples from each of the switch timing signals $\phi 1$ and $\phi 2$ that are fundamental clocks).

(C) A configuration of the feedback circuit is switched by the clocks and switching control over the order of the filter.

By thus configuring, it is possible to provide a delta-sigma AD converter apparatus capable of reducing a circuit area, suppressing current consumption, and switching a signal band and an SNR.

Figure 1:
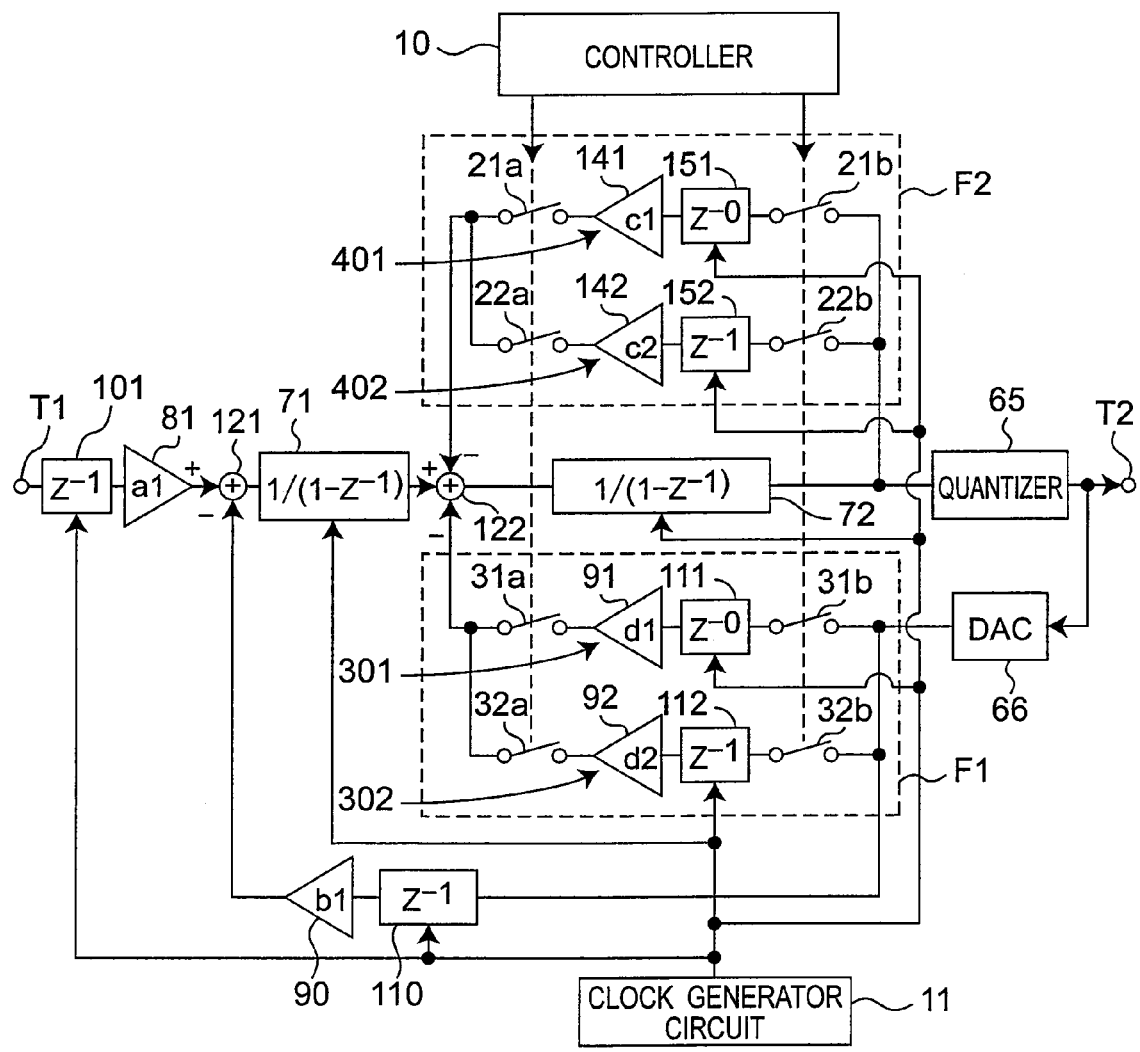
FIG. 1 is a block diagram showing a configuration of a variable-order delta-sigma modulator according to a first preferred embodiment of the present invention.

FIG. 1 is a block diagram showing a configuration of a variable-order delta-sigma modulator according to a first preferred embodiment of the present invention. The variable-order delta-sigma modulator according to the first preferred embodiment is an example of a third-order filter, including integrators 71 and 72 each including two operational amplifiers, and switching the number of delay units. Generally speaking, the delta-sigma modulator is also referred to as "delta-sigma AD converter and modulator".

Referring to FIG. 1, the variable-order delta-sigma modulator is configured to include a delay unit 101 having a transfer function of $Z^{-1}$ for Z conversion, two operational amplifiers 81 and 90 having amplification factors a1 and b1, respectively, two integrators 71 and 72 each having a transfer function of $1/(1-Z^{-1})$ for Z conversion, a quantizer 65, a DA converter 66, two feedback circuits F1 and F2, a delay unit 110 having a transfer function of $Z^{-1}$ for Z conversion, a controller 10, and a clock generator circuit 11 supplying a clock having a predetermined cycle to the integrators 71 and 72 and delay units 101, 110 to 112, 151, and 152. The feedback circuit F1 includes two charge holding circuits 301 and 302. The charge holding circuit 301 is configured to include a switch 31a, an operational amplifier 91 having an amplification factor d1, a delay unit 111 having a transfer function of $Z^{-0}$ for Z conversion, and a switch 31b. The charge holding circuit 302 is configured to include a switch 32a, an operational amplifier 92 having an amplification factor d2, a delay unit 112 having a transfer function of $Z^{-1}$ for Z conversion, and a switch 32b. In addition, the feedback circuit F2 includes two charge holding circuits 401 and 402. The charge holding circuit 401 is configured to include serial circuits including a switch 21a, an operational amplifier 141 having an amplification factor c1, a delay unit 151 having a transfer function of $Z^{-0}$ for Z conversion, and a switch 21b. The charge holding circuit 402 is configured to include serial circuits including a switch 22a, an operational amplifier 142 having an amplification factor c2, a one-sample delay unit 152 having a transfer function of $Z^{-1}$ for Z conversion, and a switch 22b.

An analog signal inputted to an input terminal T1 of the variable-order delta-sigma modulator is inputted to a subtractor 121 via the delay unit 101 and the operational amplifier 81. The subtractor 121 subtracts an analog signal inputted from the operational amplifier 90, from the analog signal inputted from the operational amplifier 81, and outputs an analog signal representing a subtraction result to a subtractor 122 via the integrator 71. The subtractor 122 subtracts a sum of an analog signal inputted from the feedback circuit F1 and an analog signal inputted from the feedback circuit F2, from the input signal from the integrator 71, and outputs an analog signal representing a subtraction result to the quantizer 65 and the feedback circuit F2 via the integrator 72. The analog signal outputted from the integrator 72 is outputted to the subtractor 122 via the charge holding circuits 401 and 402 of the feedback circuit F2. After quantizing the inputted analog signal into a digital signal, the quantizer 65 outputs the digital signal to an output terminal T2 and the DA converter 66. After converting the inputted digital signal into an analog signal, the DA converter 66 outputs the analog signal to the subtractor 122 via the charge holding circuits 301 and 302 of the feedback circuit F1. The digital signal from the DA converter 66 is outputted to the subtractor 121 via the one-sample delay unit 110 and the operational amplifier 90.

When a wireless communication system including a signal band having a wide signal bandwidth is used, the controller 10 sets the variable-order delta-sigma modulator to have a third-order filter characteristic (i.e., a higher-order filter characteristic) by turning on all of the switches 21a, 21b, 22a, 22b, 31a, 31b, 32a, and 32b. Further, the controller 10 sets the number of quantization bits of the quantizer 65 to a larger number such as 3 or 4, and preferably sets a bias current applied to the integrators 71 and 72 to a higher value. When a wireless communication system including a signal band having a narrow signal bandwidth is used, the controller 10 sets the variable-order delta-sigma modulator to have a second-order filter characteristic (i.e., a lower-order filter characteristic) by turning on the switches 32a and 32b and turning off the other switches 21a, 21b, 22a, 22b, 31a, and 31b. Further, the controller 10 sets the number of quantization bits of the quantizer 65 to a smaller number such as 1 or 2, and preferably sets the bias current applied to the integrators 71 and 72 to a lower value.

By thus configuring, it is possible to reduce the circuit area, to reduce the current consumption, and to switch the signal band and the SNR characteristic, as compared with the prior arts.

Figure 2:
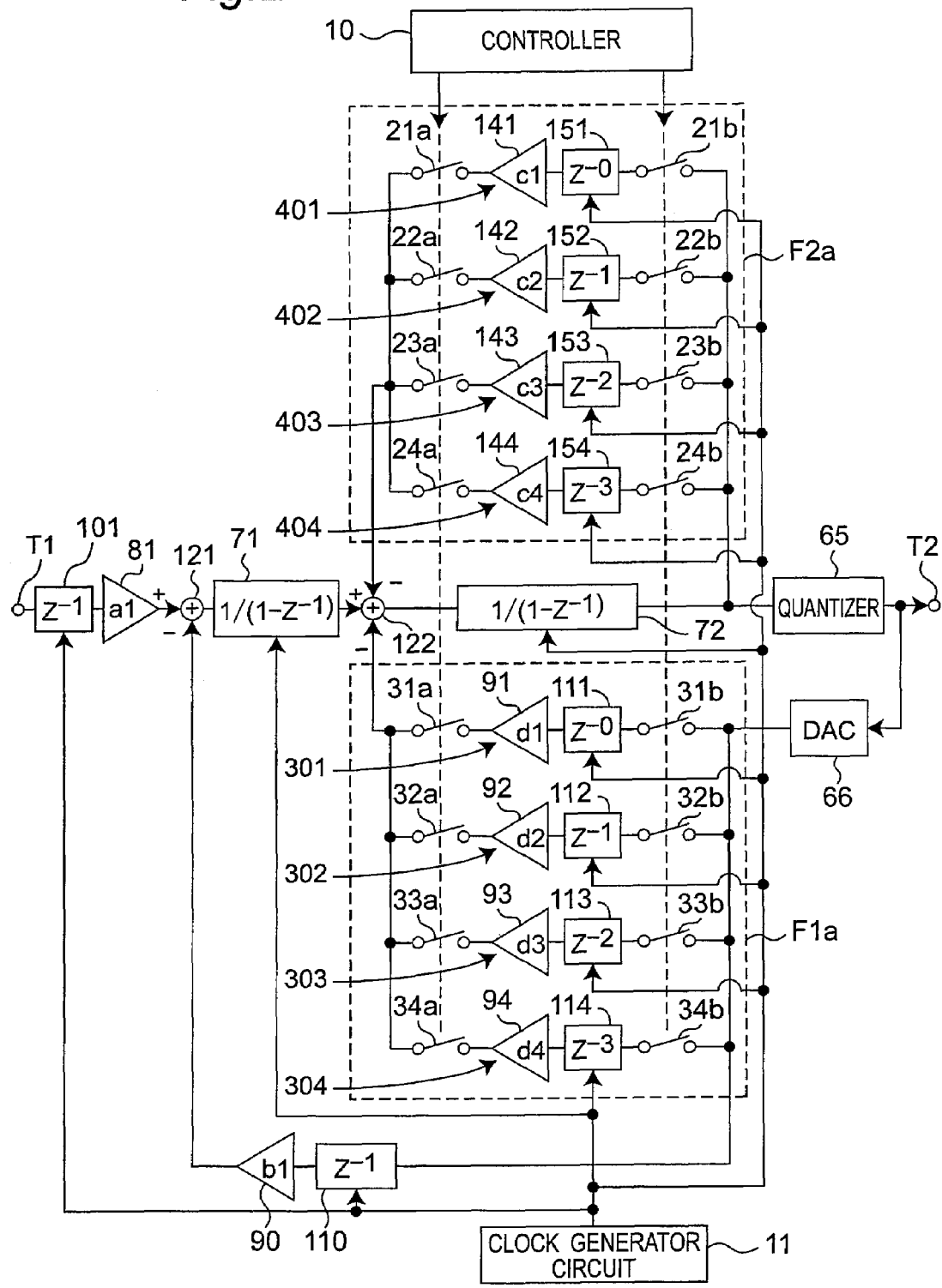
FIG. 2 is a block diagram showing a configuration of a variable-order delta-sigma modulator according to a second preferred embodiment of the present invention.

FIG. 2 is a block diagram showing a configuration of a variable-order delta-sigma modulator according to a second preferred embodiment of the present invention. The variable-order delta-sigma modulator shown in FIG. 2 differs from that shown in FIG. 1 in the following points.

(1) The feedback circuit F1 is replaced by a feedback circuit F1a and the feedback circuit F1a additionally includes charge holding circuits 303 and 304. The charge holding circuit 303 is configured to include a switch 33a, an operational amplifier 93 having an amplification factor d3, a two-sample delay unit 113 having a transfer function of $Z^{-2}$ for Z conversion, and a switch 33b. The charge holding circuit 304 is configured to include a switch 34a, an operational amplifier 94 having an amplification factor d4, a three-sample delay unit 114 having a transfer function of $Z^{-2}$ for Z conversion, and a switch 34b.

(2) The feedback circuit F2 is replaced by a feedback circuit F2a. The feedback circuit F2a additionally includes charge holding circuits 403 and 404 as compared with the feedback circuit F2. In this case, the charge holding circuit 403 is configured to include a switch 23a, an operational amplifier 143 having an amplification factor c3, a two-sample delay unit 153 having a transfer function of $Z^{-2}$ for Z conversion, and a switch 23b. The charge holding circuit 404 is configured to include a switch 24a, an operational amplifier 144 having an amplification factor c4, a three-sample delay unit 114 having a transfer function of $Z^{-3}$ for Z conversion, and a switch 24b.

When a wireless communication system including a signal band having a wide signal bandwidth is used, a controller 10 sets the variable-order delta-sigma modulator to have a fifth-order filter characteristic (i.e., a higher-order filter characteristic) by turning on all switches 21a, 21b 22a, 22b, 23a, 23b, 24a, 24a, 31a, 31b, 32a, 32b, 33a, 33b, 34a, and 34b. When a wireless communication system including a signal band having a narrow signal bandwidth is used, the controller 10 sets the variable-order delta-sigma modulator to have a second-order filter characteristic (i.e., a lower-order filter characteristic) by turning on the switches 32a and 32b and turning off the other switches 21a, 21b, 22a, 22b, 23a, 23b, 24a, 24a, 31a, 31b, 33a, 33b, 34a, and 34b.

By thus configuring, it is possible to reduce the circuit area, to reduce the current consumption, and to switch the signal band and the SNR characteristic, as compared with the prior arts.

Figure 3:
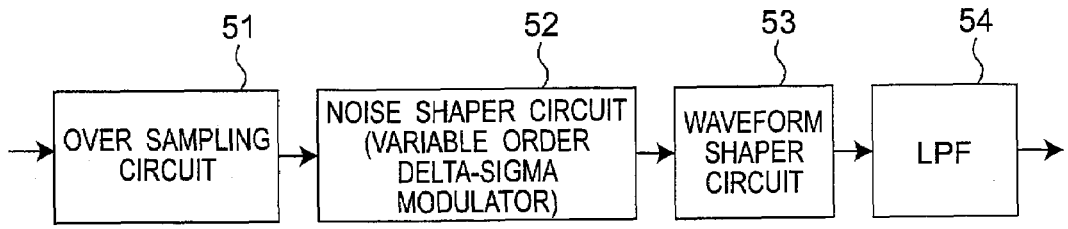
FIG. 3 is a block diagram showing a configuration of a delta-sigma DA converter apparatus according to a third preferred embodiment of the present invention.

FIG. 3 is a block diagram showing a configuration of a delta-sigma DA converter apparatus according to a third preferred embodiment of the present invention. Referring to FIG. 3, the delta-sigma DA converter apparatus is configured to include an over-sampling circuit 51, a noise shaper circuit 52 constituted by the variable-order delta-sigma modulator according to the first or second preferred embodiment, a waveform shaper circuit 53, and a low-pas filter (LPF) 54. An inputted digital signal is inputted to the over-sampling circuit 51. The over-sampling circuit 51 over-samples the digital signal so that a sampling frequency of the digital signal becomes a predetermined higher sampling frequency, and outputs the resultant digital signal to the noise shaper circuit 52. The noise shaper circuit 52 reduces low-frequency noise of the inputted digital signal, and outputs the noise-shaped digital signal via the waveform shaper circuit 53 and the LPF 54. In this case, the digital signal is converted into an analog signal by the waveform shaper circuit 53 and the LPF 54. By employing the variable-order delta-sigma modulator according to the first or second preferred embodiment as the noise shaper circuit 52, it is possible to realize a DA converter having an optimum SNR relative to the sampling frequency to be used.

According to the above-stated preferred embodiments, the filter characteristic is switched by switching the order of the filter for multiplexing by the feedback circuits F1 and F2 or F1a and F2a including the operational amplifiers of the latter stages among all the operational amplifiers. It is thereby possible to switch the order of the filter and to reduce the circuit area without increasing the number of operational amplifiers. Further, it is possible to relax the settling accuracy and the current consumption of the operational amplifiers of the latter stages so as not to largely deteriorate the SNR characteristic. Namely, the kT/C noise inputted to the operational amplifiers constituting the integrator 71 of the former stage and the noise resulting from the insufficient settling accuracy can be shifted to the range out of the signal band, which is the feature of the delta-sigma AD converter apparatus. Accordingly, it is possible to reduce current in the operational amplifiers of the latter stages, in which the noise shaping effect is effective in the range in which the deterioration in the SNR characteristic is allowable.

Figure 4:
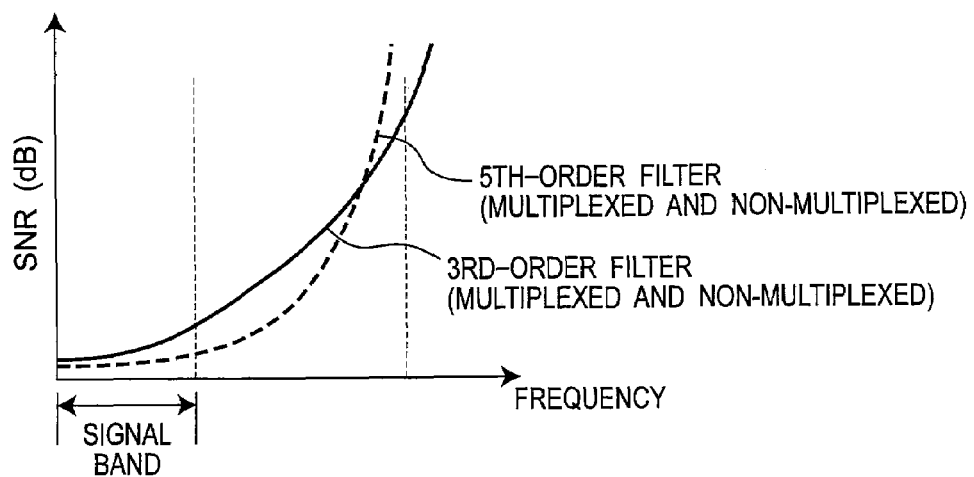
FIG. 4 is a graph showing a frequency characteristic relative to a signal-to-noise ratio (SNR) for an output signal from a delta-sigma AD converter apparatuses including the variable-order delta-sigma modulator shown in FIG. 1 or 2.
Figure 5:
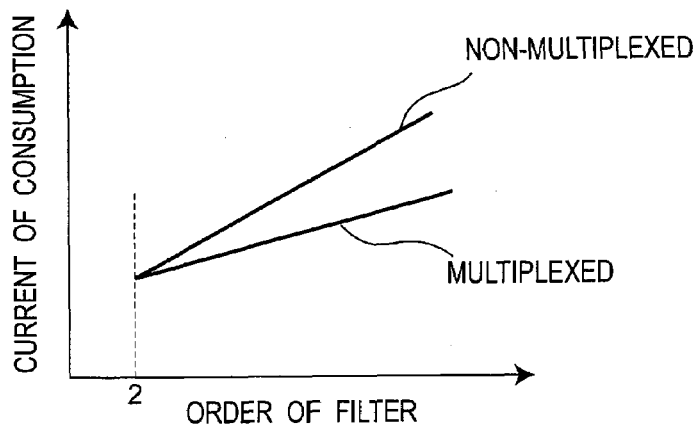
FIG. 5 is a graph showing a consumed current relative to the order of a filter for the output signal from the delta-sigma AD converter apparatus including the variable-order delta-sigma modulator shown in FIG. 1 or 2.

FIG. 4 is a graph showing a frequency characteristic relative to an SNR for an output signal from the delta-sigma AD converter apparatus including the variable-order delta-sigma modulator shown in FIGS. 1 and 2. FIG. 5 is a graph showing a consumed current relative to the order of the filter for an output signal from delta-sigma AD converter apparatus including the variable-order delta-sigma modulator shown in FIGS. 1 and 2. The following respects are obvious from FIGS. 4 and 5.

(1) When multiplexing is not carried out, the noise shaping effect is the same because of the same transfer function of the filter. In addition, if the order of the filter is increased, the SNR is improved.

(2) When multiplexing is carried out, as compared with such a case that multiplexing is not carried out, the consumed current can be reduced because of no increase in the number of operational amplifiers. However, according to an increase in the order of the filter, the current rises proportionally to an increase in a load capacity connected to the operational amplifiers.

Referring to FIGS. 6 and 7, an example of a characteristic of a fourth-order filter will be described.

Figure 6A:
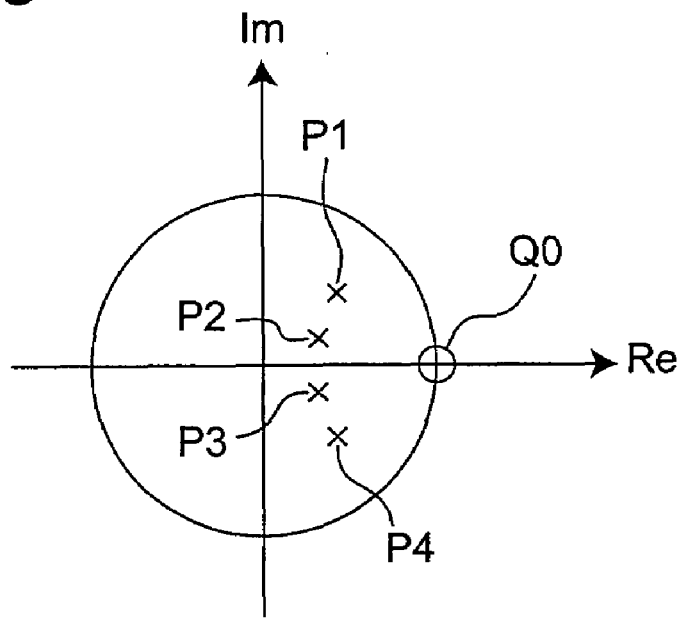
FIG. 6A is a graph showing a filter characteristic of no zero-point shift for the variable-order delta-sigma modulator shown in FIG. 2 on a Z plane.
Figure 6B:
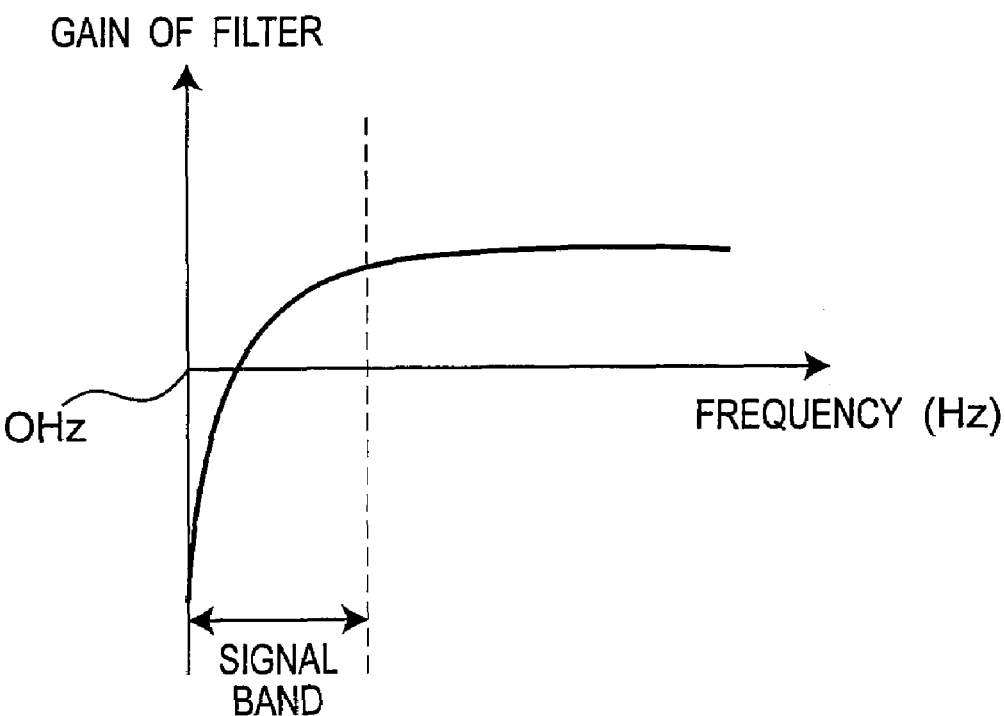
FIG. 6B is a graph showing a quantization noise filter characteristic (NTF) (i.e., the frequency characteristic relative to the gain of the filter) converted from the filter characteristic shown in FIG. 6A.

FIG. 6A is a graph showing a filter characteristic of no zero-point shift of the variable-order delta-sigma modulator shown in FIG. 2 on a Z plane. FIG. 6B is a graph showing a quantization noise filter characteristic (NTF) (i.e., the frequency characteristic relative to the gain of the filter) converted from the filter characteristic shown in FIG. 6A. When the noise filter characteristic of the fourth-order filter is plotted on the Z plane, four zero points of the transfer function of the noise filter all appear at a DC point (f=0 Hz) Q0 as shown in FIG. 6A. Due to this, as shown in the frequency characteristic of FIG. 6B, the noise filter characteristic has a larger attenuation amount at the frequency f=0 Hz. Further, when a necessary signal bandwidth is wider, the attenuation amount of the filter deteriorates on a higher frequency side.

Figure 7A:
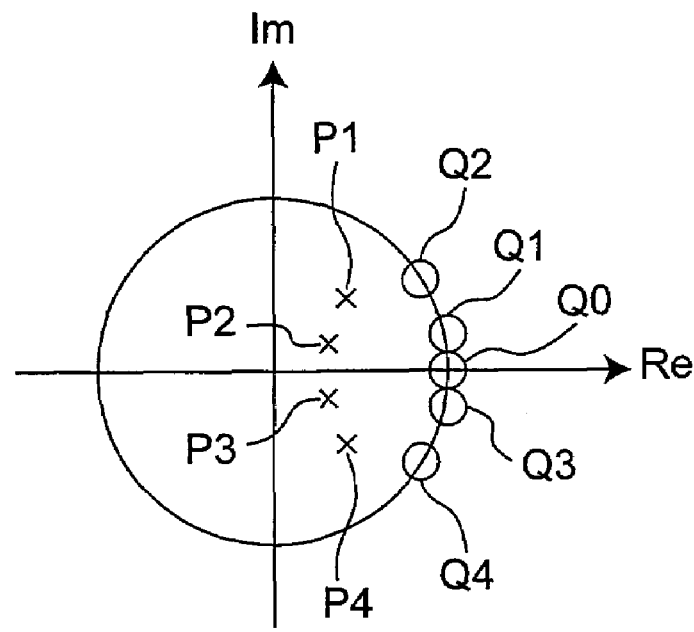
FIG. 7A is a graph showing a filter characteristic of zero-point shift for the variable-order delta-sigma modulator shown in FIG. 2 on the Z plane.
Figure 7B:
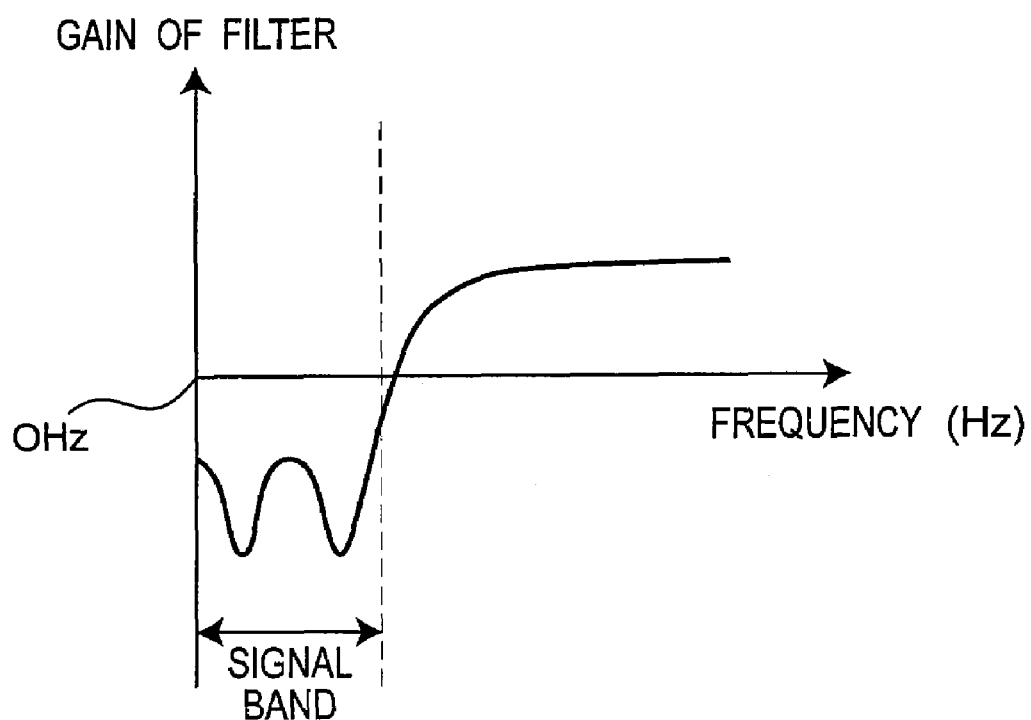
FIG. 7B is a graph showing a quantization noise filter characteristic (NTF) (i.e., the frequency characteristic relative to the gain of the filter) as converted from the filter characteristic shown in FIG. 7A.

FIG. 7A is a graph showing a filter characteristic of zero-point shift for the variable-order delta-sigma modulator shown in FIG. 2 on the Z plane. FIG. 7B is a graph showing a quantization noise filter characteristic (NTF) (i.e., the frequency characteristic relative to the gain of the filter) converted from the filter characteristic shown in FIG. 7A. As shown in FIG. 7A, an attenuation amount generated by zero points can be set to arbitrary positions. As shown in FIG. 7B, the filter characteristic having a sharper attenuation amount such as that of a Chebyshev filter can be obtained in a necessary wide signal bandwidth. Due to this, even if the order of the filter is the same, the quantization noise in the signal band can be further attenuated.

Figure 8:
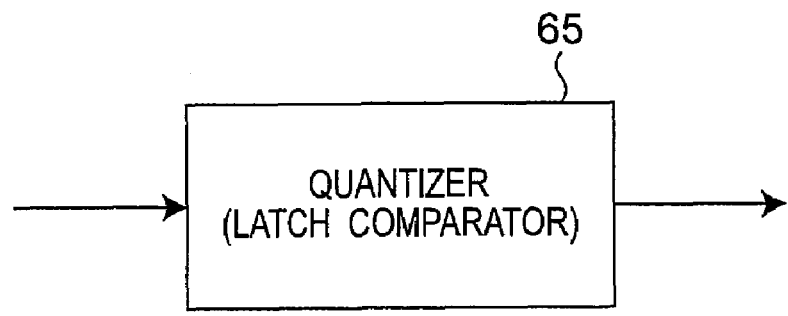
FIG. 8 is a block diagram of a quantizer 65 of a variable-order delta-sigma modulator according to a first modified preferred embodiment of the first and second modified preferred embodiments shown in FIGS. 1 and 2 when the quantizer 65 is a latch comparator.

FIG. 8 is a block diagram of a quantizer 65 of a variable-order delta-sigma modulator according to a first modified preferred embodiment of the first and second modified preferred embodiments shown in FIGS. 1 and 2 when the quantizer 65 is a latch comparator. As shown in FIG. 8, the quantizer 65 shown in FIG. 1 or 2 may be constituted by a well-known latch comparator.

Figure 9:
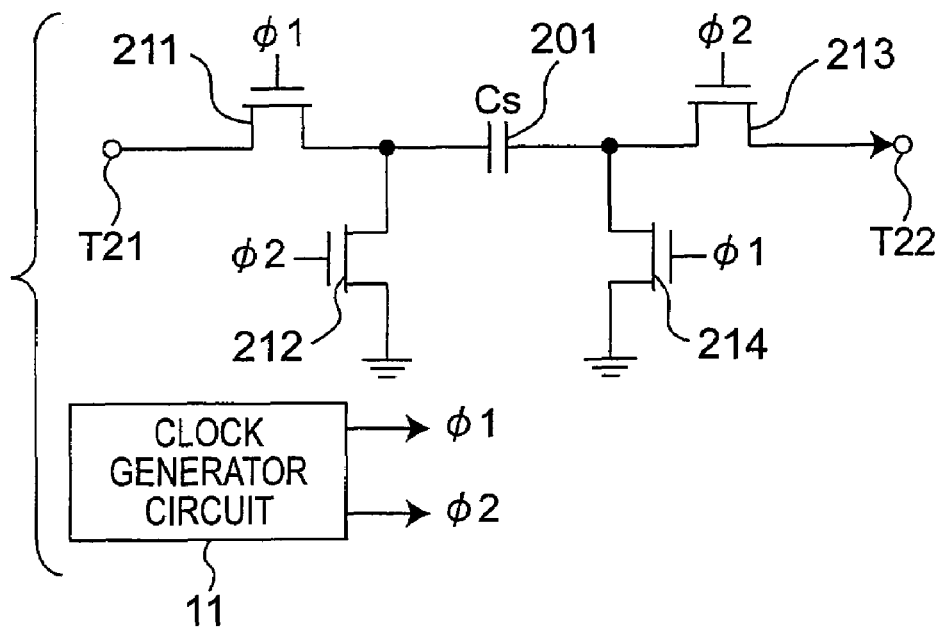
FIG. 9 is a circuit diagram showing a configuration of a switched capacitor circuit 200 used in each of charge holding circuits 301 to 304 and 401 to 404 of a variable-order delta-sigma modulator according to a second modified preferred embodiment of the first and second preferred embodiments shown in FIGS. 1 and 2.
Figure 10:
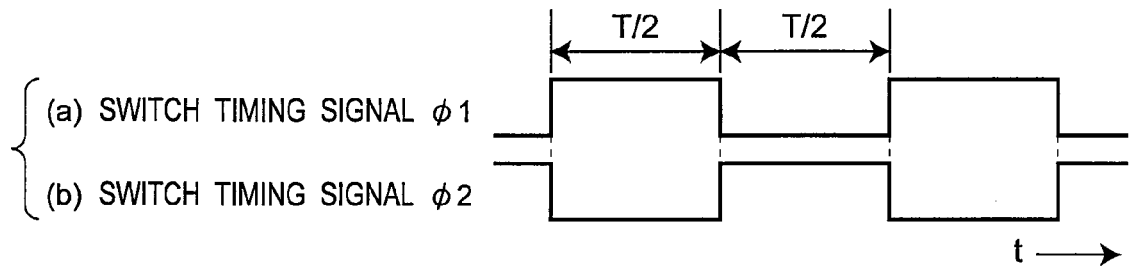
FIG. 10 is a timing chart of switch timing signals φ1 and φ2 generated by a controller 10 shown in FIGS. 9 and 11.

FIG. 9 is a circuit diagram showing a configuration of a switched capacitor circuit 200 employed in each of charge holding circuits 301 to 304 and 401 to 404 of a variable-order delta-sigma modulator according to a second modified preferred embodiment of the first and second modified preferred embodiments shown in FIGS. 1 and 2. Preferably, a pair of a delay unit 101 and an operational amplifier 81 and a pair of a delay unit 110 and an operational amplifier 90 are constituted by switched capacitor circuits, respectively. The switched capacitor circuit 200 is configured to include switches, a feedback capacity Cs, and an integral capacity Ch. FIG. 10 is a timing chart of switch timing signals $\phi 1$ and $\phi 2$ generated by a clock generator circuit 11 shown in FIGS. 9 and 11. Each of the charge holding circuits 301 to 304 and 401 to 404 shown in FIG. 1 or 2 may be constituted by the switched capacitor circuit 200 shown in FIG. 9. In a manner similar to that of above, each of a pair of the delay unit 101 and the operational amplifier 81 and a pair of the delay unit 110 and the operational amplifier 90 may be constituted by the switched capacitor circuit 200. The switched capacitor circuit 200 is configured to include four switching field effect transistors 211 to 214, a capacitor 201, and the clock generator circuit 11 for generating the switch timing signals $\phi 1$ and $\phi 2$ which are inverted signals inverted from each other and for applying the switch timing signals $\phi 1$ and $\phi 2$ to gates of the respective field effect transistors 211 to 214.

Referring to FIG. 9, an input terminal T21 is connected to an output terminal T22 via a source and a drain of the field effect transistor 211, a capacitor 201 having the capacity Cs, and a source and a drain of the field effect transistor 213. One input-side end of the capacitor 201 is grounded via a source and a drain of the field effect transistor 212, and one output-side end of the capacitor 201 is grounded via a source and a drain of the field effect transistor 214. As shown in FIG. 10, the clock generator circuit 11 generates the switch timing signal $\phi 1$, and applies the switch timing signal $\phi 1$ to the gates of the respective field effect transistors 211 and 214. In addition, the clock generator circuit 11 generates the switch timing signal $\phi 2$, and applies the switch timing signal $\phi 2$ to the gates of the respective field effect transistors 212 and 213.

As well known, the switched capacitor circuit 200 configured as stated above does not operate for double sampling but accumulates electric charges of the signal inputted to the input terminal T21 at a first timing in the capacitor 201, and outputs a voltage signal according to the accumulated electric charges via the output terminal T22 at a second timing. Namely, the input signal can be inputted to the capacitor 201 at a timing of the high-level switch timing signal $\phi 1$ for an interval T/2, and the capacitor 201 can output the output signal at a timing of the high-level switch timing signal $\phi 2$ for an interval T/2. Due to this, it is possible to output one data signal for an interval T (corresponding to one-sample delay time).

Figure 11:
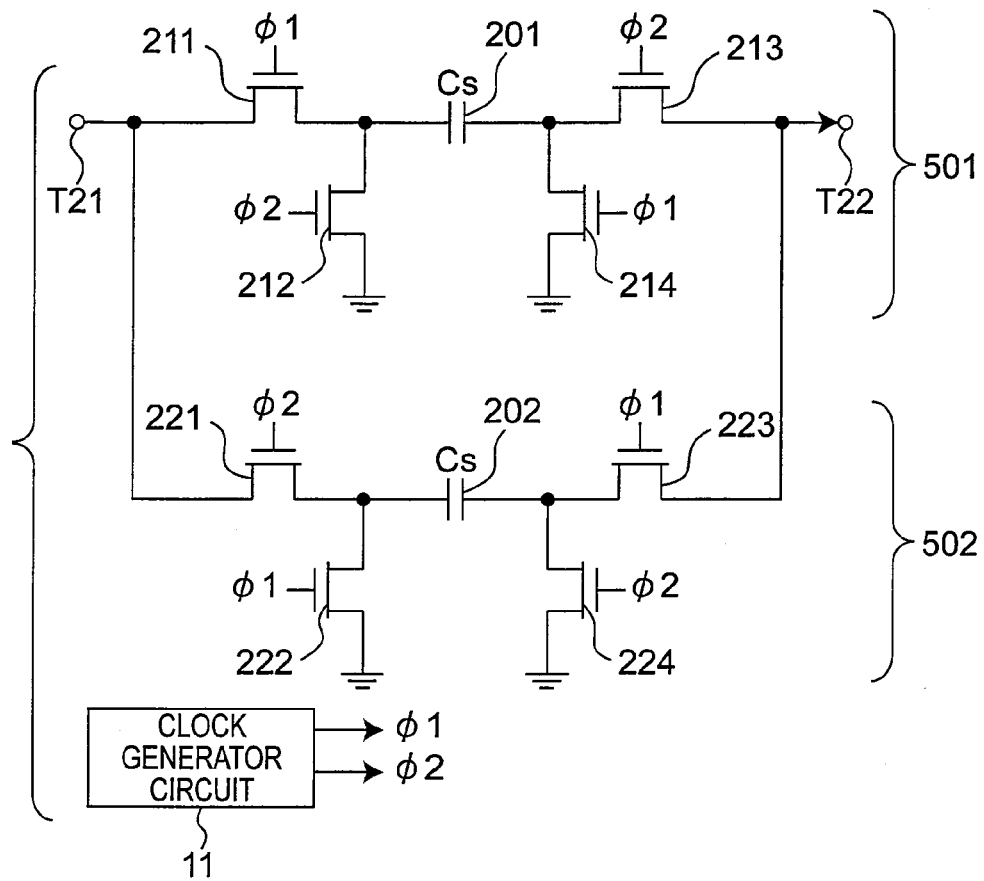
FIG. 11 is a circuit diagram showing a configuration of a switched capacitor circuit 200A used in each of charge holding circuits 301 to 304 and 401 to 404 of a variable-order delta-sigma modulator according to a third modified preferred embodiment of the first and second preferred embodiments shown in FIGS. 1 and 2.

FIG. 11 is a circuit diagram showing a configuration of a switched capacitor circuit 200A employed in each of charge holding circuits 301 to 304 and 401 to 404 of a variable-order delta-sigma modulator according to a third modified preferred embodiment of the first and second modified preferred embodiments shown in FIGS. 1 and 2. Each of the charge holding circuits 301 to 304 and 401 to 404 shown in FIG. 1 or 2 may be constituted by the switched capacitor circuit 200A shown in FIG. 11. The switched capacitor circuit 200A is configured to include eight switching field effect transistors 211 to 214 and 221 to 224, capacitors 201 and 202, and a clock generator circuit 11 for generating switch timing signals $\phi 1$ and $\phi 2$ which are inverted signals inverted from each other and for applying the switch timing signals $\phi 1$ and $\phi 2$ to gates of the respective field effect transistors 211 to 214 and 221 to 224.

Referring to FIG. 11, an input terminal T21 is connected to an output terminal T22 via a source and a drain of the field effect transistor 211, a capacitor 201 having a capacity Cs, and a source and a drain of the field effect transistor 213. One input-side end of the capacitor 201 is grounded via a source and a drain of the field effect transistor 212, and one output-side end of the capacitor 201 is grounded via a source and a drain of the field effect transistor 214. In addition, the input terminal T21 is connected to the output terminal T22 via a source and a drain of the field effect transistor 221, a capacitor 202 having the capacity Cs, and a source and a drain of the field effect transistor 223. One input-side end of the capacitor 202 is grounded via a source and a drain of the field effect transistor 222, and one output-side end of the capacitor 201 is grounded via a source and a drain of the field effect transistor 224. As shown in FIG. 11, the clock generator circuit 11 generates the switch timing signal $\phi 1$, and applies the switch timing signal $\phi 1$ to the gates of the respective field effect transistors 211 and 214. In addition, the clock generator circuit 11 generates the switch timing signal $\phi 2$, and applies the switch timing signal $\phi 2$ to the gates of the respective field effect transistors 212 and 213. Moreover, the clock generator circuit 11 generates the switch timing signal $\phi 1$ and applies the switch timing signal $\phi 1$ to the gates of the respective field effect transistors 222 and 223, and generates the switch timing signal φ2 and applies the switch timing signal φ2 to the gates of the respective field effect transistors 221 and 224.

The switched capacitor circuit 200A configured as stated above operates for double sampling, and is configured as follows:

(a) A circuit 501 to which the input signal is inputted at a timing of the high-level switch timing signal φ1 for an interval T/2 and which outputs the output signal at a timing of the high-level switch timing signal φ2 for an interval T/2, and (b) A circuit 502 which operates in an inverted manner to the circuit 501, to which the input signal is inputted at the timing of the high-level switch timing signal φ2 for the interval T/2 and which outputs the output signal at the timing of the high-level switch timing signal φ1 for the interval T/2 are allowed to operate simultaneously. Due to this, the switched capacitor circuit 200A can output two data signals for an interval T (corresponding to one-sample delay time), and halve a clock cycle to obtain the same data amount. Therefore, as compared with the switched capacitor circuit 200 without any double sampling shown in FIG. 9, settling time doubles. When the performance is the same, it is possible to relax settling accuracy and to reduce current consumption.

FIG. 12 is a circuit diagram showing a configuration of the clock generator circuit 11 shown in FIG. 1 or 2. FIG. 13 is a timing chart of signals generated by the clock generator circuit 11 shown in FIG. 12.

Referring to FIG. 12, the clock generator circuit 11 is configured to include a fundamental clock generator circuit 230 and a two-timing-delay clock generator circuit 240. The fundamental clock generator circuit 230 includes an inverter 231. A sampling clock signal φs having a cycle T is outputted as the switch timing signal φ1 as it is, and is outputted as the switched timing signal φ2 after being inverted by the inverter 231. The two-timing-delay clock generator circuit 240 is configured to include a one-half frequency divider 241, an inverter 242, and two AND gates 243 and 244. The one-half frequency divider 241 halves a frequency of the inputted sampling clock signal φs, and outputs the resultant sampling clock signal φs to the AND gate 243 and to the AND gate 244 via the inverter 242. The AND gate 243 performs an AND operation among the signal from the one-half frequency divider 241, the switch timing signal φ1, and a order-of-filter switch control signal Sc from the controller 10 that becomes high level at the time of setting to the higher-order filter characteristic and that becomes low level at the time of setting to the lower-order filter characteristic, and outputs an operation result signal as a two-timing-delay switch timing signal φ1$_{2D}$. In addition, the AND gate 244 performs an AND operation among the signal from the inverter 242, the switched timing signal φ2, and the order-of-filter switch control signal Sc, and outputs an operation result signal as a two-timing-delay switch timing signal φ2$_{2D}$.

The signals generated by the clock generator circuit 11 configured as stated above are shown in FIG. 13. While the two-timing-delay switch timing signals φ1$_{2D}$ and φ2$_{2D}$ are shown in FIGS. 12 and 13, 2n-timing-delay switch timing signals (where "n" is a natural number equal to or larger than one) can be similarly generated based on the ½n frequency-divided signal of the sampling clock φs, a 2(n−1)-timing-delay switch timing signal, and the order-of-filter switch control signal Sc.

For example, according to the prior arts, a method of generating 2n signals indicating duty ratios of 1/(2n) using a ring oscillator, and controlling the 2n signals while shifting the delay timing is used. However, when the method is used, the jitter noise generated in an outputted clock signal is normally large, then this leads to deterioration in the SNR. The clock generator circuit 11 shown in FIG. 12 according to the present preferred embodiment generates a n-timing-delay switch timing signal using the fundamental clock generator circuit 230 based on the sampling clock φs having a smaller jitter amount. Due to this, it is possible to reduce the jitter noise and to reduce the deterioration in the SNR, as compared with the prior arts. Moreover, because of no need to control the delay timing, the relevant circuits can be simplified.

Figure 14:
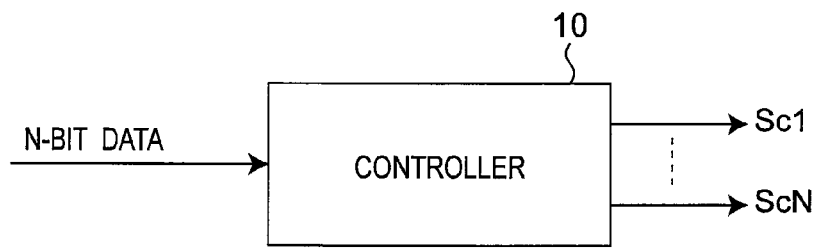
FIG. 14 is a block diagram showing a configuration of the controller 10 shown in FIGS. 1 and 2.

FIG. 14 is a block diagram showing a configuration of the controller 10 shown in FIGS. 1 and 2. Referring to FIG. 14, the controller 10 converts inputted N-bit order-of-filter control signals (serial signals) indicating the order of the filter into N one-bit switch control signals Sc1, Sc2, ..., and ScN having either high level or low level, and outputs the N one-bit switch control signals Sc1, Sc2, ..., and ScN to the feedback circuits F1 and F2 or F1a and F2a. When the order of the filter is switched between two orders, it suffices to output one signal such as the order-of-filter switch control signal Sc shown in FIG. 12.

Figure 15:
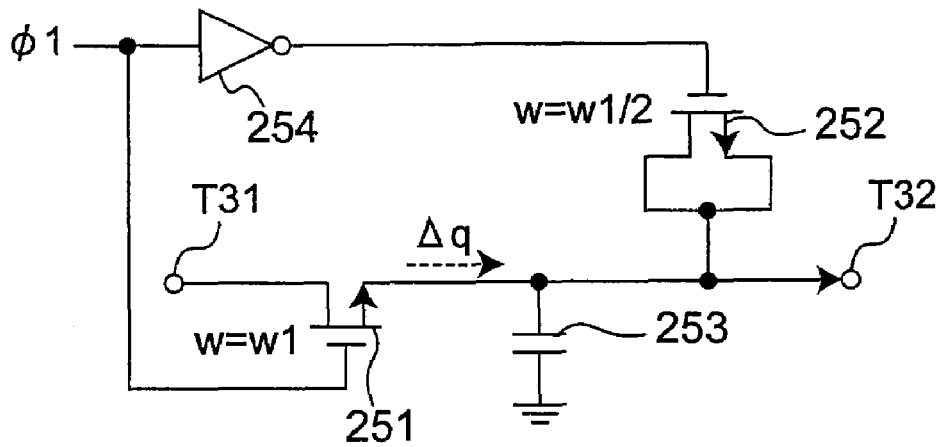
FIG. 15 is a circuit diagram showing a configuration of a dummy switch circuit 211A that is an example of a switch employed in switched capacitor circuits 200 and 200A shown in FIGS. 9 and 11, respectively.

FIG. 15 is a circuit diagram showing a configuration of a dummy switch circuit 211A that is an example of a switch employed in each of the switched capacitor circuits 200 and 200A shown in FIGS. 9 and 11, respectively (i.e., a switch by each field effect transistor). Referring to FIG. 15, the dummy switch circuit 211A is configured to include an inverter 254, two n-type MOS field effect transistor switches (referred to as nMOS switches hereinafter) 251 and 252, and a capacitor 253. An input terminal T31 is connected to a drain of the nMOS switch 251 having a gate width w1, a source of the nMOS switch 251 is grounded via the capacitor 252. Further, the input terminal T31 is connected to a source and a drain of the nMOS switch 252 having a gate width w1/2a and an output terminal T32. The switch timing signal φ1 is applied to a gate of the nMOS switch 251 and to a gate of the nMOS switch 252 via the inverter 254.

The dummy switch 211A as configured above includes the nMOS switch 251, and the nMOS switch 252 having a gate area which is half the gate area of the nMOS switch 251. In the dummy switch 211A, the drain and the source of the other nMOS switch 252 are connected to an output terminal of one nMOS switch 251, the nMOS switch 251 is turned on or off based on the switch timing signal 1, and the nMOS switch 252 is turned on or off based on the inverted switch timing signal φ1. Referring to FIG. 15, when the nMOS switch 251 is turned off based on the switch timing signal φ1, the nMOS switch 251 outputs electric charges Δq accumulated between the drain and the source of the nMOS switch 251 to the drain and the source of the nMOS switch 252. In this case, when the nMOS switch 252 serving as a dummy switch is not used, then the electric charges Δq are accumulated in the capacitor 253, and error occurs to a charge amount of the capacitor 253. This error is normally referred to as a channel charge injection. On the other hand, when the nMOS switch 252 serving as a dummy switch is turned off at the timing when the nMOS switch 251 is turned off, an amount of electric charges absorbed or discharged by the nMOS switch 251 is proportional to the area of the gate. Due to this, the nMOS switch 252 serving as the dummy switch absorbs electric charges by a charge amount of Δq/2 from each of the source and the drain. Namely, the electric charges Δq output from the nMOS switch 251 are absorbed by the nMOS switch 252 serving as the dummy switch and not accumulated in the capacitor 253. Due to this, the error that the charge amount of the capacitor 253 fluctuates can be improved. Therefore, it is possible to reduce the deterioration in the SNR.

Figure 16:
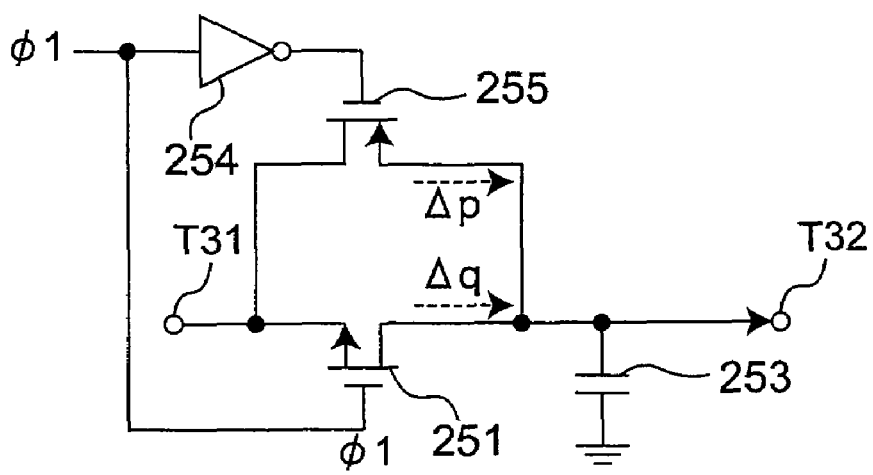
FIG. 16 is a circuit diagram showing a configuration of a CMOS switch circuit 211B that is an example of the switch employed in the switched capacitor circuits 200 and 200A shown in FIGS. 9 and 11, respectively.
Figure 17:
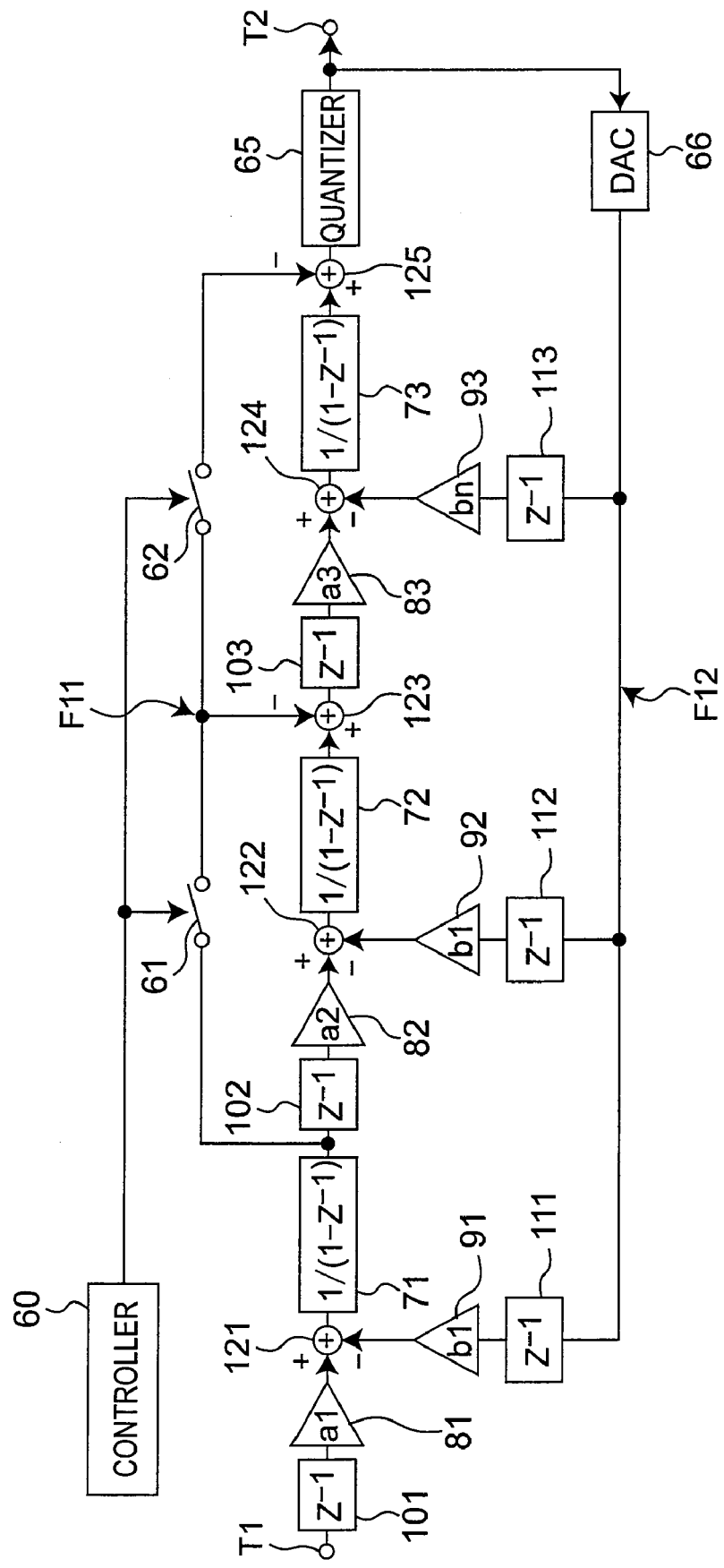
FIG. 17 is a block diagram showing a configuration of a variable-order delta-sigma modulator according to a first prior art.
Figure 18:
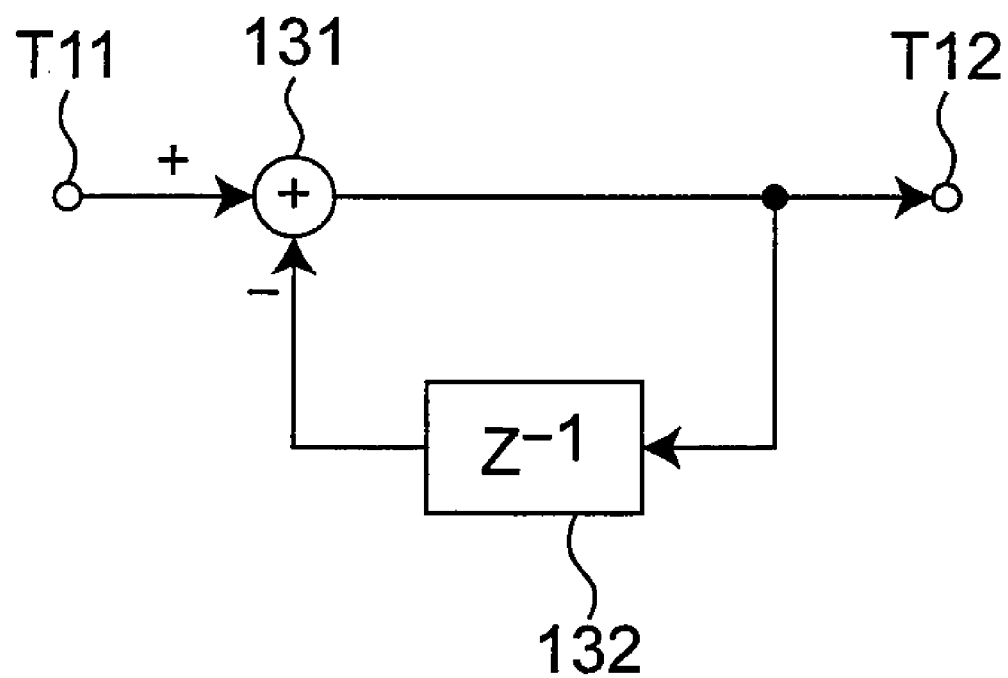
FIG. 18 is a block diagram showing a configuration of each of integrators 71, 72, and 73 shown in FIG. 17.

FIG. 16 is a circuit diagram showing a CMOS switch 211B that is an example of a switch employed in each of the switched capacitor circuits 200 and 200A shown in FIGS. 9 and 11, respectively (i.e., a switch made by each field effect transistor). Referring to FIG. 16, the CMOS switch 211B is configured to include an inverter 254, a CMOS circuit including two MOS field effect transistor switches 251 and 255, and a capacitor 253. The switch 255 is a p-type field effect transistor switch (referred to as a pMOS switch hereinafter). An input terminal T31 is connected to a drain of the nMOS switch 251 and a source of the pMOS switch 255, and a source of the nMOS switch 251 and a drain of the pMOS switch 255 are grounded via the capacitor 252. Further, the input terminal T31 is connected to an output terminal T32. The switch timing signal $\phi 1$ is applied to a gate of the nMOS switch 251 and to a gate of the pMOS switch 255 via the inverter 254.

In the CMOS switch circuit 211B configured as stated above, when the nMOS switch 251 is turned off based on the switch timing signal $\phi 1$, the nMOS switch 251 outputs electric charges $\Delta q$ accumulated between the drain and the source of the nMOS switch 251 to the pMOS switch 255. On the other hand, the pMOS switch 255 opposite in polarity to the nMOS switch 251 because a switch timing signal inverted from the switch timing signal $\phi 1$ inputted to the nMOS switch 251 is applied to the pMOS switch 255 is turned off simultaneously when the nMOS switch 255 is turned off, and outputs holes $\Delta p$ accumulated between the source and the drain of the pMOS switch 255 to the nMOS switch 251. In this case, the electric charges and the holes discharged from the nMOS switch 251 and the pMOS switch 255, respectively, are opposite in polarity. Therefore, by adjusting gate areas (or gate widths) of the respective MOS switches 251 and 255 in such a state that the charge amounts $\Delta q$ and $\Delta p$ are equal ($\Delta q=\Delta p$) to each other, no electric charge is accumulated in the capacitor 253 connected to the output terminals of the MOS switches 251 and 255. Due to this, the error when the charge amount of the capacitor 253 fluctuates can be improved. It is thereby possible to reduce error when a reference voltage is generated. Generally speaking, the CMOS switch circuit can reduce a resistance value in an operative state, as compared with a switch circuit configured to include only the nMOS switch 251 or the pMOS switch 255. Therefore, it is possible to improve a parasitic capacity of the output signal from the switch circuit, and to improve the time delay caused by a first-order RC filter constituted by a resistance component of the switch circuit. Accordingly, it is possible to reduce the deterioration in the SNR.

The functions and advantageous effects of the present preferred embodiments and the modified preferred embodiments of the present preferred embodiments will next be described.

As shown in FIG. 8, when the quantizer 65 is constituted by the well-known latch comparator and the filter characteristic (i.e., SNR) in the signal band of the wide signal bandwidth can be set to be smaller than that in the signal band of the narrow signal bandwidth, a noise amount in the signal band can be increased. Therefore, it is possible to further reduce current consumed by the operational amplifiers. In this case, a determination timing of the quantizer 65 may be equal to the timing of turning off the switch timing signal $\phi 2$. Due to this, the quantizer 65 operates only based on the high-level switch timing signal $\phi 2$, and the latch comparator which is turned off based on the high-level switch timing signal $\phi 1$ can be used as the quantizer 65. It is thereby possible to reduce the current consumption.

Moreover, the quantizer 65 is allowed to operate synchronously with the timing when the reference voltage generator in the controller 10 outputs each determination voltage. Due to this, it is possible to prevent comparison error generated when the quantizer determines when no reference voltage is inputted. Besides, as for the filter characteristic in the signal band of the narrow signal bandwidth, the noise in the signal band is mainly caused by the kT/C noise. Due to this, it is possible to decrease the number of bits and to reduce the current consumed by the quantizer 65 in the range in which the quantization noise does not influence the SNR.

Each of the switched capacitor circuits 200 and 200A shown in FIGS. 9 and 11, respectively, absorbs and discharges the electric charges synchronously with the switch timing signals $\phi 1$ and $\phi 2$ that are clock signals. When the clock signal for discharge is not inputted to the switched capacitor circuit 200 or 200A, the capacitors 201 and 202 hold the absorbed electric charges. It is thereby possible to simplify the configuration of each charge holding circuit.

In each of the switched capacitor circuits 200 and 200A shown in FIGS. 9 and 11, respectively, MIM (Metal-Insulator-Metal) capacitors, MOM (Metal-Oxide-Metal) capacitors or the like can be normally employed as the capacitors 201 and 202 configured by holding an electric insulator between a pair of metal wirings. The variation or fluctuations in the capacity values of these capacitors can be suppressed to be smaller than that of the ordinary capacitor. Therefore, it is possible to reduce the error when each reference voltage is generated.

As stated so far in detail, the variable-order delta-sigma modulator according to the present invention and the delta-sigma DA converter apparatus using the variable-order delta-sigma modulator switches its filter characteristic by switching the order of the filter for multiplexing using the feedback circuits. It is thereby possible to switch the order of the filter without increasing the number of the operational amplifiers amplifying signals, and to reduce the circuit area. Further, the settling accuracy of the operational amplifiers of the latter stages can be relaxed to prevent the SNR characteristic from being remarkably deteriorated, and the current consumption can be thereby reduced. Namely, the kT/C noise inputted to the operational amplifier of the former stage and the noise resulting from the insufficient settling accuracy are shifted to the range out of the signal band, which is the feature of the delta-sigma AD converter apparatus. Accordingly, the current consumed by the operational amplifiers of the latter stages exhibiting the notable noise shaping effect can be reduced in the range in which the deterioration in the SNR is allowed.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A delta-sigma modulator comprising:
   a first subtractor for subtracting an inputted second input signal from an inputted first input signal, and outputting an analog signal representing a subtraction result of the first subtractor;
   a first integrator for integrating the analog signal outputted from the first subtractor, and outputting an integrated analog signal;
   a second subtractor for subtracting a sum of an inputted third analog signal and an inputted fourth analog signal from the analog signal outputted from the first integrator, and outputting an analog signal representing a subtraction result of the second subtractor;

a second integrator integrating the analog signal outputted from the second subtractor, and outputting an integrated analog signal;

a quantizer for quantizing the analog signal outputted from the second integrator into a digital signal, and outputting the digital signal;

a DA converter for DA-converting the digital signal outputted from the quantizer into an analog signal, and outputting the analog signal;

a first feedback circuit including a plurality of first charge holding circuits for holding electric charges of the analog signal outputted from the DA converter for different sampling intervals, respectively, the first feedback circuit capable of changing a feedback amount of the analog signal outputted from the DA converter, and outputting the analog signal from each of the first charge holding circuits to the second subtractor as a third analog signal;

a second feedback circuit including a plurality of second charge holding circuits for holding electric charges of the analog signal outputted from the second integrator for different sampling intervals, respectively, the second feedback circuit capable of changing a feedback amount of the analog signal outputted from the second integrator, and outputting an analog signal from each of the second charge holding circuits to the second subtractor as a fourth analog signal, and a controller for switching an order of a filter of a filter characteristic of the delta sigma modulator by changing feedback amounts of the first and second feedback circuits.

2. The delta-sigma modulator as claimed in claim 1, wherein each of the first and second feedback circuits is configured to switch over between a filter characteristic of zero-point shift and a filter characteristic of no zero-point shift by switching the order of the filter by the controller.

3. The delta-sigma modulator as claimed in claim 2, wherein each of the first and second charge holding circuits included in the first and second feedback circuits is made to operate at a double sampling timing.

4. The delta-sigma modulator as claimed in claim 2, wherein each of the first and second feedback circuits include:

a fundamental clock generator circuit for generating a fundamental clock; and an n-timing-delay clock generator circuit for generating an n-timing-delay clock signal delayed from the fundamental clock by an interval of "n" samples, where "n" is a natural number equal to or larger than two, wherein the "n"-timing-delay clock generator circuit generates the n-timing-delay signal by combining the fundamental clock output from the fundamental clock generator circuit with an n-frequency-divided clock, and wherein the controller switches an operation performed by the n-timing-delayed clock generator circuit according to switching of the order of the filter.

5. The delta-sigma modulator as claimed in claim 2, wherein the controller converts an inputted N-bit order-of-filter control signal indicating the order of the filter into N one-bit switch control signals, and outputs the N one-bit switch control signals, thereby changing the feedback amounts of the first and second feedback circuits and switching the order of the filter for the filter characteristic of the delta-sigma modulator.

6. The delta-sigma modulator as claimed in claim 2, wherein the controller changes a bias current applied to each of the first and second integrator according to an order-of-filter control signal.

7. The delta-sigma modulator as claimed in claim 1, wherein the quantizer is constituted by a latch comparator.

8. The delta-sigma modulator as claimed in claim 7, wherein the controller changes number of quantization bits of the quantizer according to the order-of-filter control signal.

9. The delta-sigma modulator as claimed in claim 2, wherein each of the first and second charge holding circuits is constituted by a switched capacitor circuit.

10. The delta-sigma modulator as claimed in claim 9, wherein the switched capacitor circuit includes:

a MOS transistor switch;

a dummy switch constituted by a MOS transistor having a drain and a source connected to an output side of the MOS transistor switch; and a capacitor, wherein the dummy switch and the MOS transistor switch are constituted so that a gate area of the dummy switch is half of a gate area of the MOS transistor switch, and wherein the controller controls the dummy switch and the MOS transistor switch to be turned off at the same timing.

11. The delta-sigma modulator as claimed in claim 10, wherein each of the MOS transistor switch and the dummy switch is constituted by a CMOS transistor.

12. The delta-sigma modulator as claimed in claim 10, wherein the capacitor is constituted by providing an insulator between a pair of metal wirings.

13. A delta-sigma DA converter apparatus comprising:

an over-sampling circuit for over-sampling an inputted digital signal;

a noise shaper circuit including a delta-sigma modulator, the noise shaper circuit shaping a noise of the over-sampled digital signal; and a low-pass filter for low-pass-filtering a noise-shaped digital signal, and outputting a low-pass-filtered noise-shaped digital signal, wherein the delta-sigma modulator comprises:

a first subtractor for subtracting an inputted second input signal from an inputted first input signal, and outputting an analog signal representing a subtraction result of the first subtractor;

a first integrator for integrating the analog signal outputted from the first subtractor, and outputting an integrated analog signal;

a second subtractor for subtracting a sum of an inputted third analog signal and an inputted fourth analog signal from the analog signal outputted from the first integrator, and outputting an analog signal representing a subtraction result of the second subtractor;

a second integrator integrating the analog signal outputted from the second subtractor, and outputting an integrated analog signal;

a quantizer for quantizing the analog signal outputted from the second integrator into a digital signal, and outputting the digital signal;

a DA converter for DA-converting the digital signal outputted from the quantizer into an analog signal, and outputting the analog signal;

a first feedback circuit including a plurality of first charge holding circuits for holding electric charges of the analog signal outputted from the DA converter for different sampling intervals, respectively, the first feedback circuit capable of changing a feedback amount of the analog signal outputted from the DA converter, and outputting the analog signal from each of the first charge holding circuits to the second subtractor as a third analog signal;

a second feedback circuit including a plurality of second charge holding circuits for holding electric charges of the analog signal outputted from the second integrator for different sampling intervals, respectively, the second feedback circuit capable of changing a feedback amount of the analog signal outputted from the second integrator, and outputting an analog signal from each of the second charge holding circuits to the second subtractor as a fourth analog signal, and a controller for switching an order of a filter of a filter characteristic of the delta sigma modulator by changing feedback amounts of the first and second feedback circuits.

* * * * *